(12) United States Patent
Cheng

(10) Patent No.: US 12,205,997 B2
(45) Date of Patent: Jan. 21, 2025

(54) INTEGRATED CIRCUIT INCLUDING BACKSIDE CONDUCTIVE VIAS

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 492 days.

(21) Appl. No.: 17/501,852

(22) Filed: Oct. 14, 2021

(65) Prior Publication Data

US 2022/0293750 A1    Sep. 15, 2022

Related U.S. Application Data

(60) Provisional application No. 63/160,442, filed on Mar. 12, 2021.

(51) Int. Cl.
| | | |
|---|---|---|
| *H01L 21/00* | (2006.01) | |
| *H01L 21/02* | (2006.01) | |
| *H01L 21/285* | (2006.01) | |
| *H01L 21/8234* | (2006.01) | |
| *H01L 23/00* | (2006.01) | |

(Continued)

(52) U.S. Cl.
CPC .... *H01L 29/41733* (2013.01); *H01L 21/0259* (2013.01); *H01L 21/28518* (2013.01); *H01L 21/823412* (2013.01); *H01L 21/823425* (2013.01); *H01L 21/823475* (2013.01); *H01L 21/823481* (2013.01); *H01L 24/08* (2013.01); *H01L 24/80* (2013.01); *H01L 25/0657* (2013.01); *H01L 25/18* (2013.01); *H01L 25/50* (2013.01); *H01L 27/088* (2013.01); *H01L 29/0665* (2013.01); *H01L 29/401* (2013.01); *H01L 29/42392* (2013.01); *H01L 29/78696* (2013.01); *H01L 2224/08145* (2013.01); *H01L 2224/80895* (2013.01); *H01L 2224/80896* (2013.01); *H01L 2924/1431* (2013.01); *H01L 2924/1434* (2013.01)

(58) Field of Classification Search
CPC .......... H01L 29/41733; H01L 21/0259; H01L 21/28518
See application file for complete search history.

(56) References Cited

U.S. PATENT DOCUMENTS 8,759,949 B2 * 6/2014 Yu ................... H01L 21/6836
 257/737
9,236,267 B2    1/2016 De et al.
(Continued)

FOREIGN PATENT DOCUMENTS

| CN | 114709190 A | * | 7/2022 | ......... H01L 21/0259 |
| CN | 116682729 A | * | 9/2023 | ............. B82Y 40/00 |

(Continued)

*Primary Examiner* — Laura M Menz
(74) *Attorney, Agent, or Firm* — Seed IP Law Group

(57) ABSTRACT

An integrated circuit includes a first chip bonded to a second chip. The first chip includes gate all around transistors on a substrate. The first chip includes backside conductive vias extending through the substrate to the gate all around transistors. The second chip includes electronic circuitry electrically connected to the transistors by the backside conductive vias.

20 Claims, 19 Drawing Sheets

(51) Int. Cl.
*H01L 25/00* (2006.01)
*H01L 25/065* (2023.01)
*H01L 25/18* (2023.01)
*H01L 27/088* (2006.01)
*H01L 29/06* (2006.01)
*H01L 29/40* (2006.01)
*H01L 29/417* (2006.01)
*H01L 29/423* (2006.01)
*H01L 29/786* (2006.01)

(56) References Cited

U.S. PATENT DOCUMENTS

| | | | |
|---|---|---|---|
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 9,978,708 | B2 * | 5/2018 | Chen ................. H01L 21/76898 |
| 10,420,171 | B2 * | 9/2019 | Goktepeli ............. H01L 23/481 |
| 11,437,283 | B2 * | 9/2022 | Lilak ................. H01L 23/53295 |
| 11,527,539 | B2 * | 12/2022 | Hsu ....................... G11C 11/412 |
| 2010/0225002 | A1 * | 9/2010 | Law ....................... H01L 23/481 257/E21.597 |
| 2020/0294998 | A1 * | 9/2020 | Lilak ...................... H01L 23/481 |
| 2021/0375883 | A1 * | 12/2021 | Hsu .......................... G11C 7/12 |
| 2022/0293750 | A1 * | 9/2022 | Cheng ................. H01L 29/78696 |
| 2022/0336474 | A1 * | 10/2022 | Liaw ................... H01L 29/0665 |
| 2022/0352032 | A1 * | 11/2022 | Lilak ................... H01L 29/0673 |
| 2022/0352158 | A1 * | 11/2022 | Cheng ................ H01L 29/42392 |
| 2023/0068312 | A1 * | 3/2023 | Parikh ................. H01L 29/78687 |
| 2023/0105495 | A1 * | 4/2023 | Hsu ....................... G11C 11/412 257/368 |
| 2023/0134741 | A1 * | 5/2023 | Huang ............. H01L 29/66439 257/401 |
| 2023/0178435 | A1 * | 6/2023 | Huang ................ H01L 21/8221 257/351 |
| 2023/0189495 | A1 * | 6/2023 | Morrow .............. H01L 27/0207 257/351 |
| 2023/0282717 | A1 * | 9/2023 | Guler ................ H01L 29/41775 257/288 |
| 2023/0377983 | A1 * | 11/2023 | Smith ............... H01L 21/76895 |
| 2023/0377985 | A1 * | 11/2023 | Smith ............... H01L 29/66439 |
| 2023/0378138 | A1 * | 11/2023 | Smith ..................... H01L 25/50 |
| 2023/0411391 | A1 * | 12/2023 | Cheng ............ H01L 21/823871 |
| 2024/0006317 | A1 * | 1/2024 | Sharma ........... H01L 21/823487 |
| 2024/0088217 | A1 * | 3/2024 | Chu ..................... H01L 29/0649 |

FOREIGN PATENT DOCUMENTS

| | | | | |
|---|---|---|---|---|
| EP | 4300561 A1 | * | 1/2024 | ....... H01L 21/76898 |
| TW | 202236608 A | * | 9/2022 | ......... H01L 21/0259 |
| WO | WO-2023225155 A1 | * | 11/2023 | ....... H01L 21/76802 |

* cited by examiner

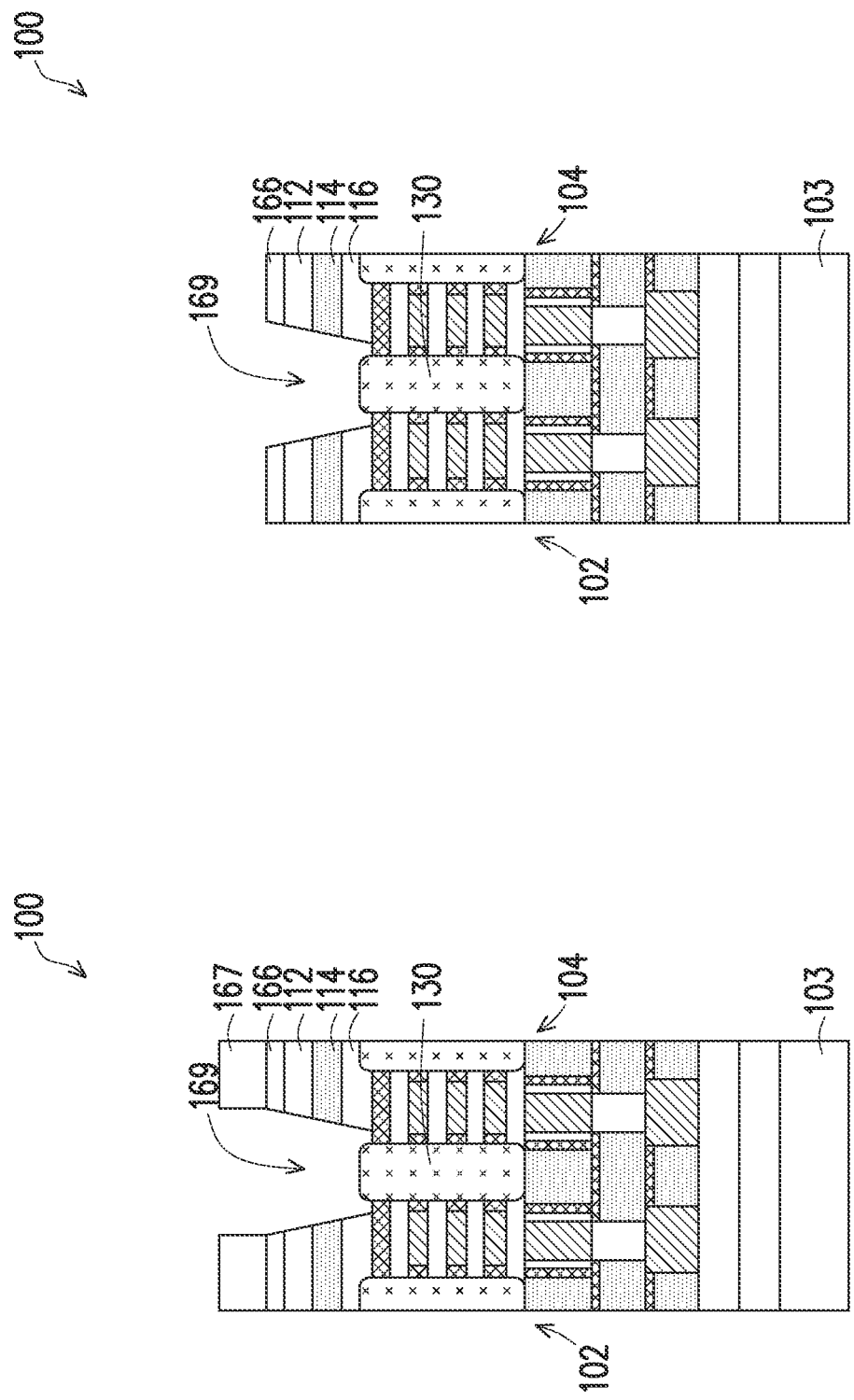

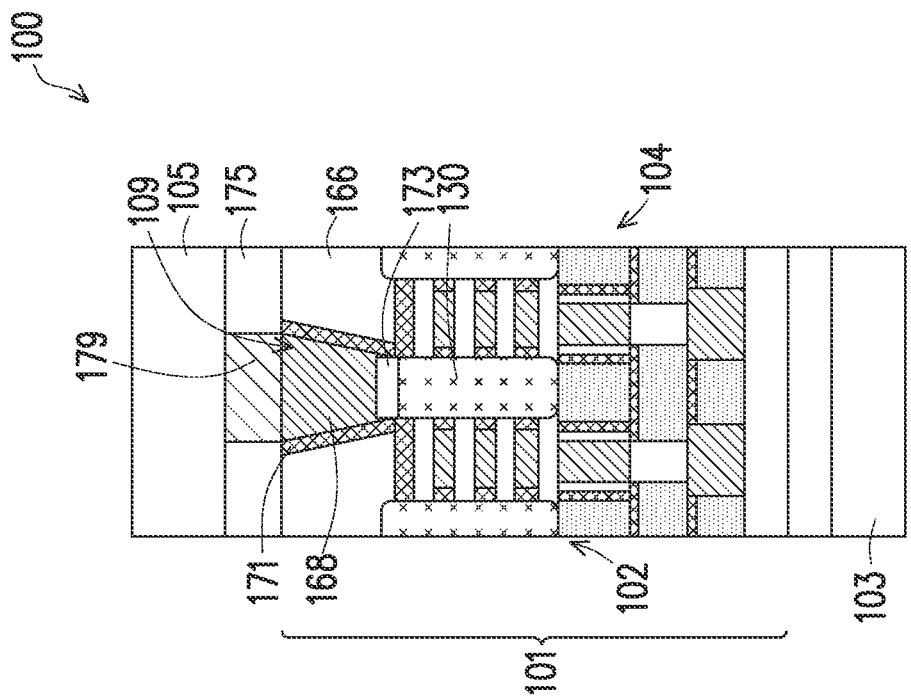
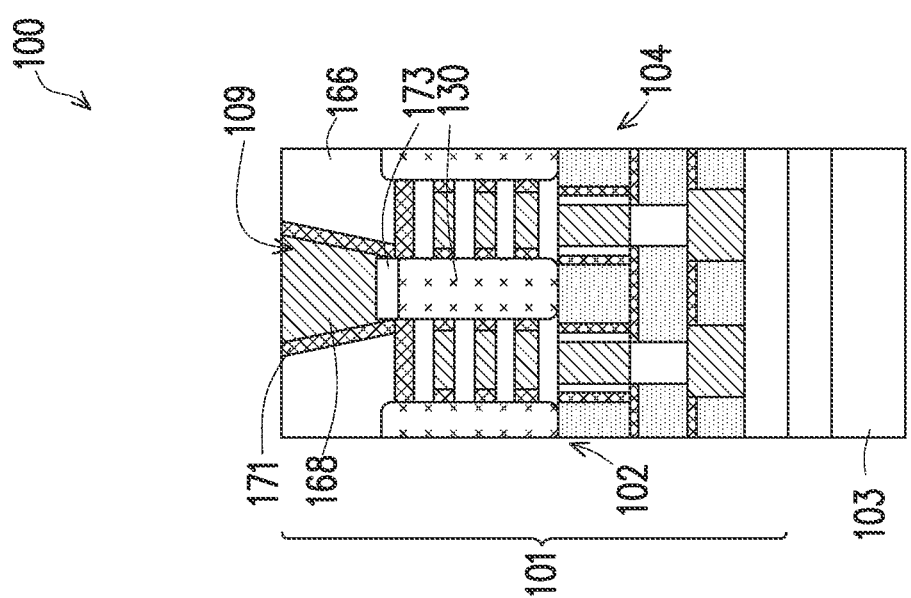

600

602

FORM A FIRST GATE ALL AROUND TRANSISTOR ON A SEMICONDUCTOR SUBSTRATE IN A FIRST WAFER, WHEREIN THE SEMICONDUCTOR SUBSTRATE INCLUDES A FIRST SEMICONDUCTOR LAYER, AN ETCH STOP LAYER ON THE FIRST SEMICONDUCTOR LAYER, AND A SECOND SEMICONDUCTOR LAYER ON THE ETCH STOP LAYER

604

FORM A BACKSIDE CONDUCTIVE VIA EXTENDING THROUGH THE SEMICONDUCTOR SUBSTRATE TO A SOURCE REGION OF THE FIRST GATE ALL AROUND TRANSISTOR

606

BOND A SECOND WAFER TO THE SEMICONDUCTOR SUBSTRATE

FIG. 6

INTEGRATED CIRCUIT INCLUDING BACKSIDE CONDUCTIVE VIAS

BACKGROUND

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, these techniques also face serious difficulties in ensuring that the features are properly formed.

Many integrated circuits include memory arrays. The reduction in the size of integrated circuit features extends to the memory cells of the memory arrays. However, it can be difficult to form effective memory cells at smaller and smaller technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H are cross-sectional views of an integrated circuit at various stages of processing, according to some embodiments.

FIG. 6 is a flow diagram of a method for operating an electronic device, according to some embodiments.

DETAILED DESCRIPTION

Figure 1:
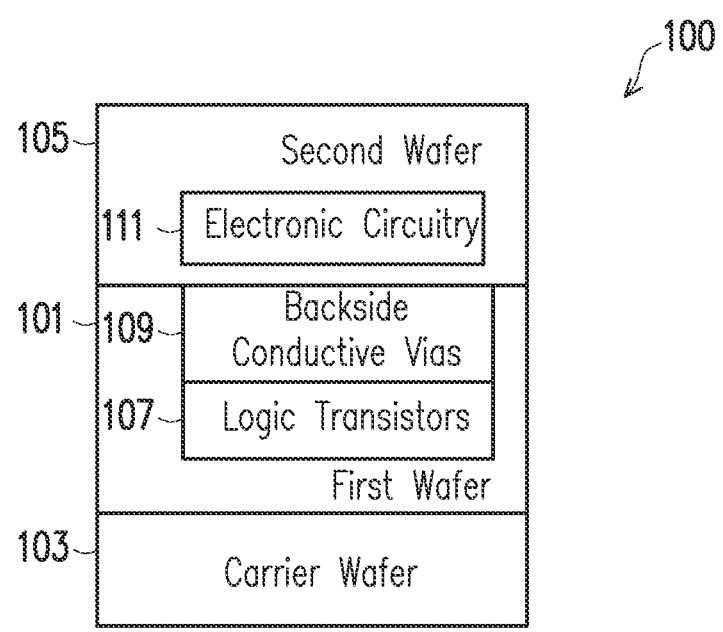
FIG. 1 is a block diagram of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide integrated circuits with dense arrays of gate all around transistors. The gate all around transistors are formed in a first wafer over a semiconductor substrate that includes an etch-stop layer between adjacent semiconductor layers. After formation of the gate all around transistors, the first wafer is flipped. Conductive backside vias are formed through the semiconductor substrate from the backside of the first wafer to contact the source and drain regions of the transistors. A second wafer is then bonded to the first wafer. The second wafer includes electronic circuitry. The electronic circuitry is electrically connected to the transistors through the backside conductive vias. The etch-stop layer in the semiconductor substrate helps to ensure that over-etching of the semiconductor substrate does not occur, thereby protecting the gate all around transistors.

The backside conductive vias provide many benefits. For example, electronic circuitry such as memory arrays or sensor arrays are formed in the second wafer, while logic transistors are formed in the first wafer. This enables highly dense formation of transistors in the first wafer. Because the etch-stop layer prevents over-etching, proper functionality of the gate all around transistors is ensured. Integrated circuits have higher performance and there are fewer scrapped wafers, resulting in higher yields.

FIG. 1 is a block diagram of an integrated circuit 100, in accordance with some embodiments. The integrated circuit 100 includes a first wafer 101 and a second wafer 105. The first wafer includes logic transistors 107. The second wafer includes electronic circuitry 111. The first wafer 101 includes backside conductive vias 109 that electrically connect the logic transistors 107 to the electronic circuitry 111. As will be set forth in more detail below, the backside vias 109 are formed in a manner that reduces the risk of damage to the logic transistors 107.

The logic transistors 107 may include nanostructure transistors. Each nanostructure transistor can include a plurality of nanostructures that act as channel regions of the transistor. The nanostructures can include semiconductor nanosheets, semiconductor nanowires, or other types of nanostructures. The nanostructure transistors can include gate all around transistors. Each gate all around transistor includes one or more gate metals surrounding the semiconductor nanostructures, with gate dielectric materials positioned between the semiconductor nanostructures and the gate metals. The logic transistors 107 can include other types of transistors without departing from the scope of the present disclosure.

The gate all around transistor structure may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

The electronic circuitry 111 can include one or more memory arrays. The memory arrays can include one or more of magnetic random access memory (MRAM) cells, resistive random access memory (RRAM) cells, phase change random access memory (PCRAM) cells, dynamic random access memory (DRAM) cells, flash memory cells, or other types of memory cells. The electronic circuitry 111 can include image sensors or other types of sensors. Because the electronic circuitry 111 is positioned in the second wafer 105, the first wafer 101 can be reserved primarily for the logic transistors 107, enabling dense formation of logic transistors 107 in the first wafer 101.

The first wafer 101 includes backside vias 109 that electrically connect the logic transistors 107 to the electronic circuitry 111. The backside vias 109 are formed though the backside substrate of the first wafer 101 to electrically connect to source and drain regions of the logic transistors 107. Accordingly, in the orientation shown in FIG. 1, the first wafer 101 has been flipped so that the backside of the first wafer 101 facing upward.

After the logic transistors 107 have been formed in the first wafer 101, the first wafer 101 is flipped so that the backside substrate faces upward. The backside substrate initially includes a first thick semiconductor layer, a second thinner semiconductor layer, and an etch-stop layer positioned between the first semiconductor layer and the second semiconductor layer. After the first wafer has been flipped, the first thick semiconductor layer will be etched such that the first semiconductor layer is either mostly removed or entirely removed, depending on the particular process. The presence of the etch-stop layer helps to ensure that over-etching does not occur. Because the first semiconductor layer is very thick, a relatively long etching process is used to entirely or mostly remove the first semiconductor layer. Due to the long duration of this etching process, there may be some amount of uneven etching during the etching process. If the etch-stop layer is not present, this uneven etching can etch entirely through portions of the first and second semiconductor layers and may damage the logic transistors 107. The presence of the etch-stop layer ensures that the etching of the first thick semiconductor layer does not damage the logic transistors 107 because the etching process will not etch the etch-stop layer.

In some embodiments, the first semiconductor layer is only partially removed. The backside vias 109 have been formed through the remaining portions of the first semiconductor layer, the etch-stop layer, and the second semiconductor layer to contact the source and drain regions of the logic transistors 107. In this case, the backside vias 109 may be referred to as "through-silicon vias" or "through-semiconductor vias".

In some embodiments, the first semiconductor layer is entirely removed. After complete removal of the first semiconductor layer, the etch-stop layer is removed. After the etch-stop layer is removed, the second thin semiconductor layer is carefully removed. Because the second semiconductor layer is very thin, a short, carefully controlled etching process can be utilized to remove the second thin semiconductor layer without damaging the logic transistors 107. After removal of the second thin semiconductor layer, a dielectric layer is formed on the backside of the first wafer 101 in place of the semiconductor substrate. The backside vias 109 are formed through the dielectric layer to contact the source and drain regions of the logic transistors 107. In this case, the backside vias 109 may be referred to as "through oxide vias" or "through dielectric vias".

In some embodiments, the etch-stop layer is a dielectric layer. For example, the semiconductor substrate may be a semiconductor on insulator (SOI) substrate. This may include a first thick layer of monocrystalline silicon, an etch-stop layer of silicon dioxide, and a second thin layer of monocrystalline silicon. Other semiconductor and dielectric materials can be utilized for the SOI substrate without departing from the scope of the present disclosure.

In some embodiments, the etch-stop layer is a semiconductor layer of different material than the first and second semiconductor layers. For example, the first and second semiconductor layers may be monocrystalline silicon. The etch-stop layer may be silicon germanium of a composition such that the monocrystalline silicon can be selectively etched with respect to the silicon germanium. Other semiconductor materials can be utilized for the semiconductor layers and the etch-stop layer without departing from the scope of the present disclosure.

After formation of the backside vias 109, the second wafer 105 is bonded to the backside of the first wafer 101. The second wafer 105 may include conductive surface structures that physically contact the backside vias 109 during the wafer bonding process. The conductive surface structures and the backside vias 109 enable electrical connection between the logic transistors 107 and electronic circuitry 111.

In some embodiments, the integrated circuit 100 may include a carrier wafer 103. The carrier wafer 103 is bonded to the front side of the first wafer 101 prior to flipping the first wafer 101.

FIG. 1 refers to first and second "wafers" because the logic transistors 107, the backside vias 109, and the electronic circuitry are initially formed in un-diced wafers that are then bonded together. After the wafer bonding process, individual integrated circuits 100 will be diced from the bonded wafers. Each integrated circuit 100 will include a chip of the first wafer 101 and a chip of the second wafer 105. Accordingly, a final packaged integrated circuit 100 will not include entire first and second wafers but will include chips from the first and second wafers.

Figure 2B:
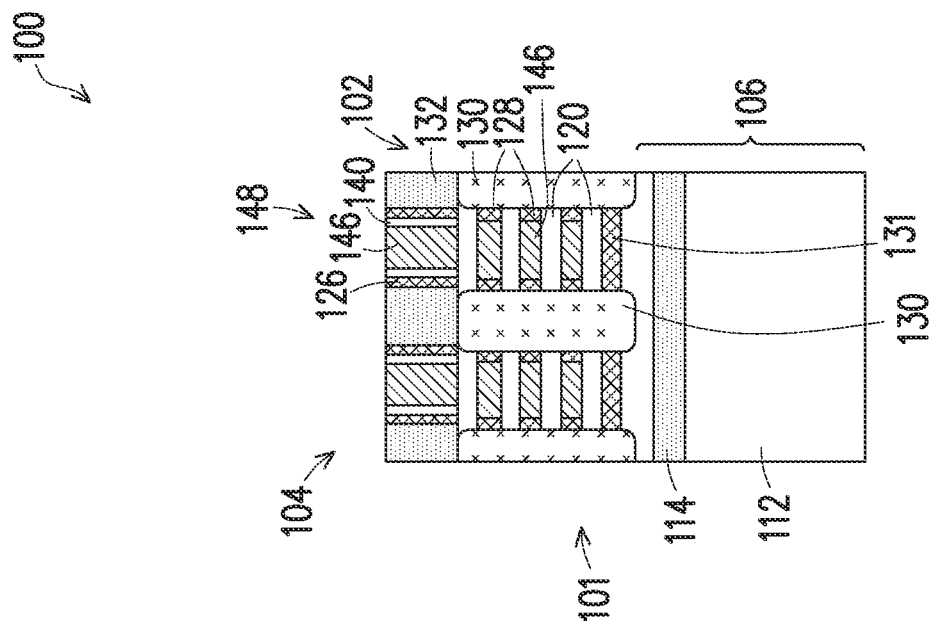
FIGS. 2A-2P are cross-sectional views of an integrated circuit at various stages of processing, according to some embodiments.
Figure 2A:
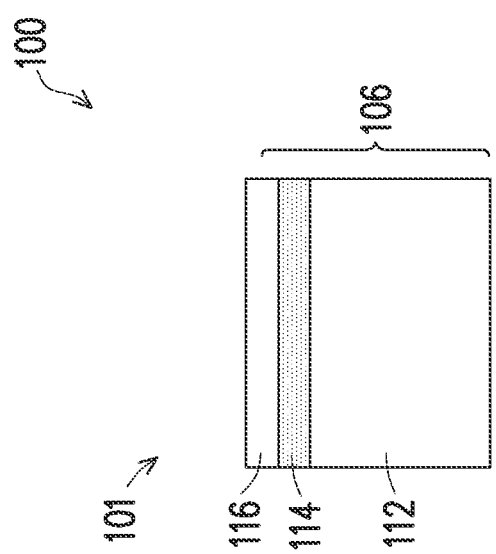
Figure 2D:
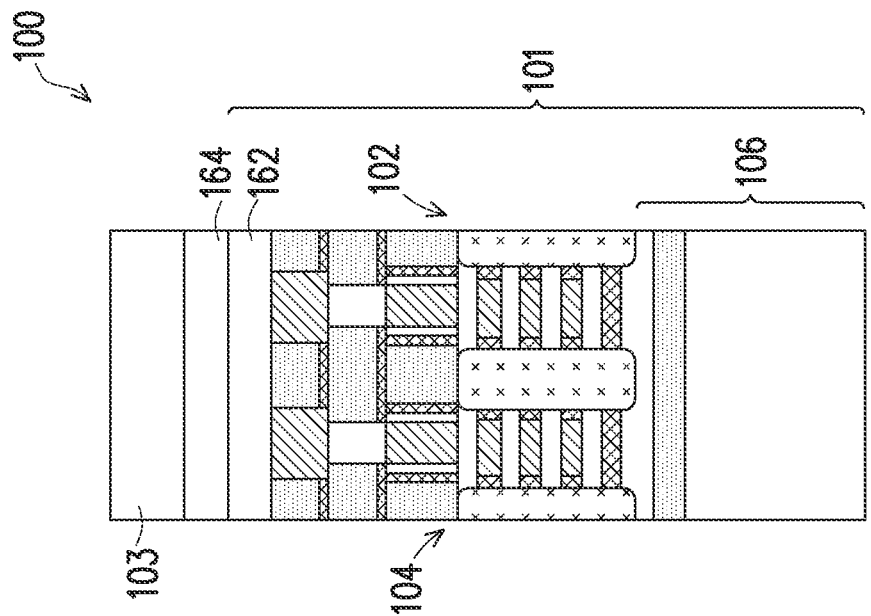
Figure 2C:
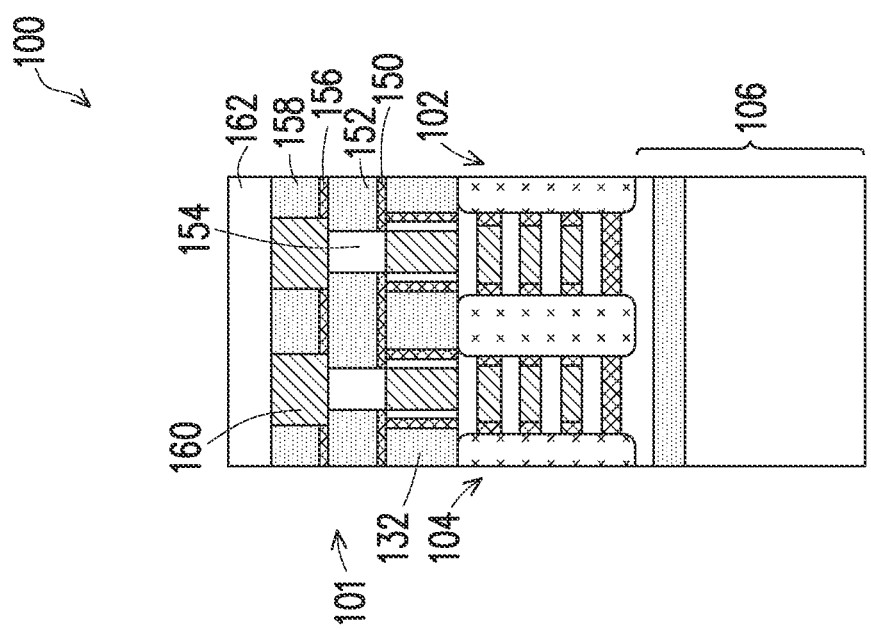
Figure 2E:
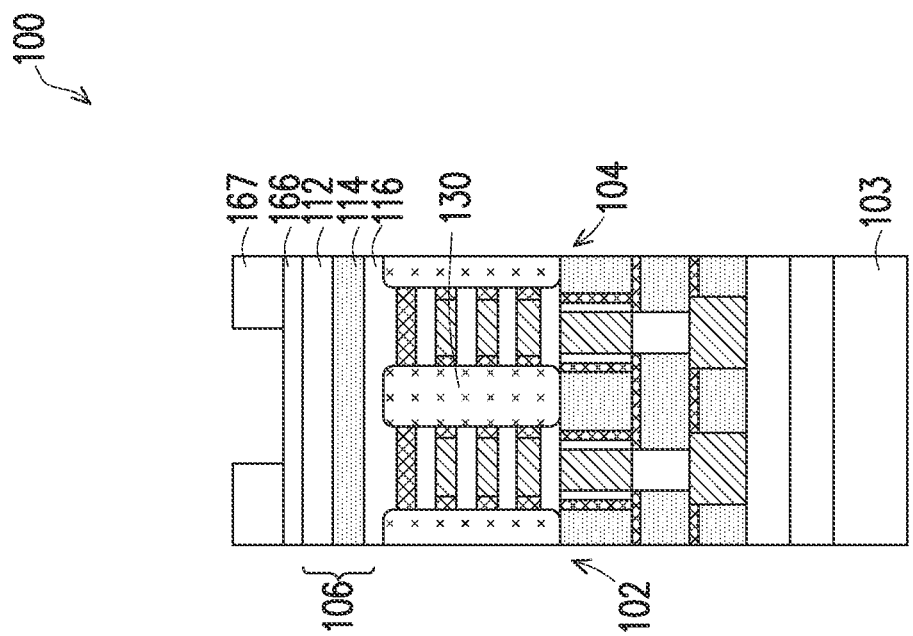
Figure 2F:
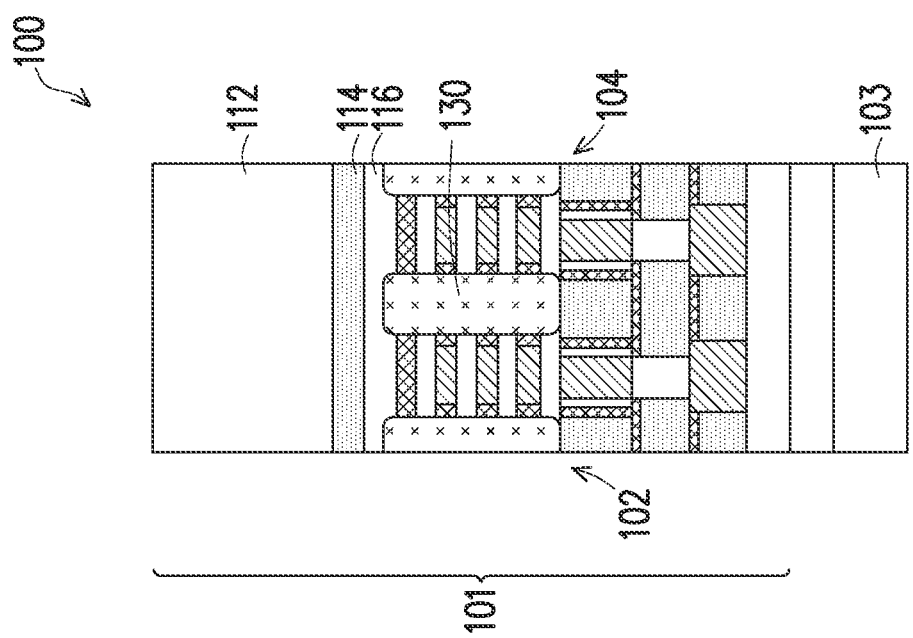
Figure 2J:
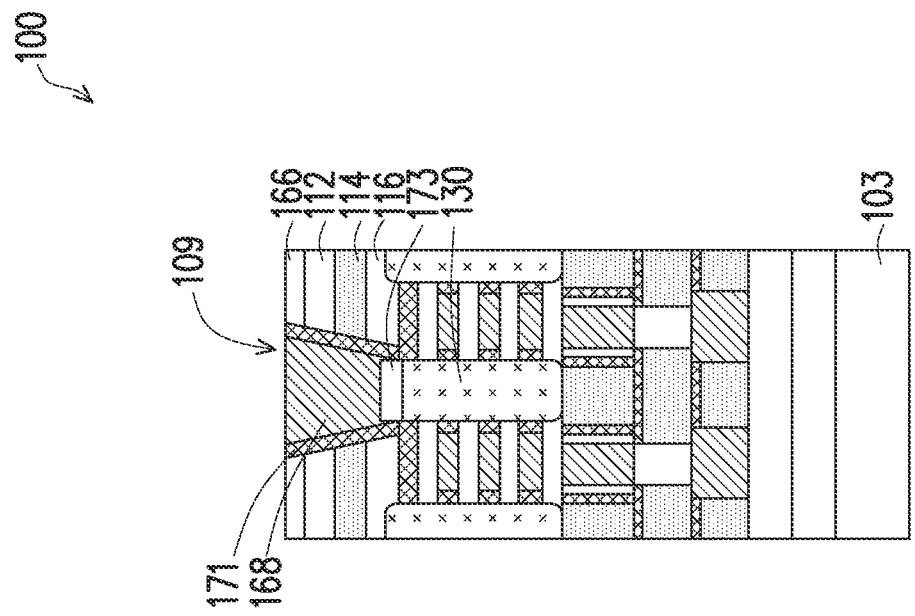
Figure 2I:
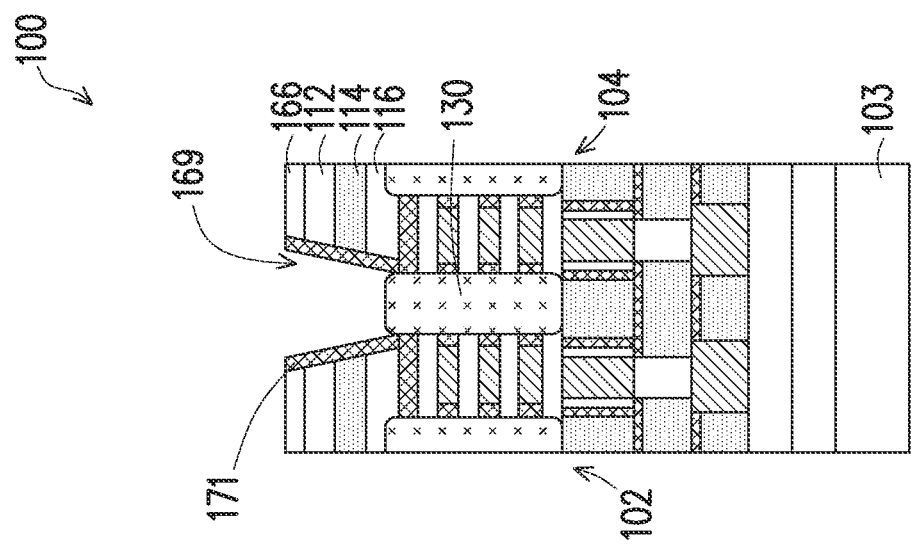
Figure 2K:
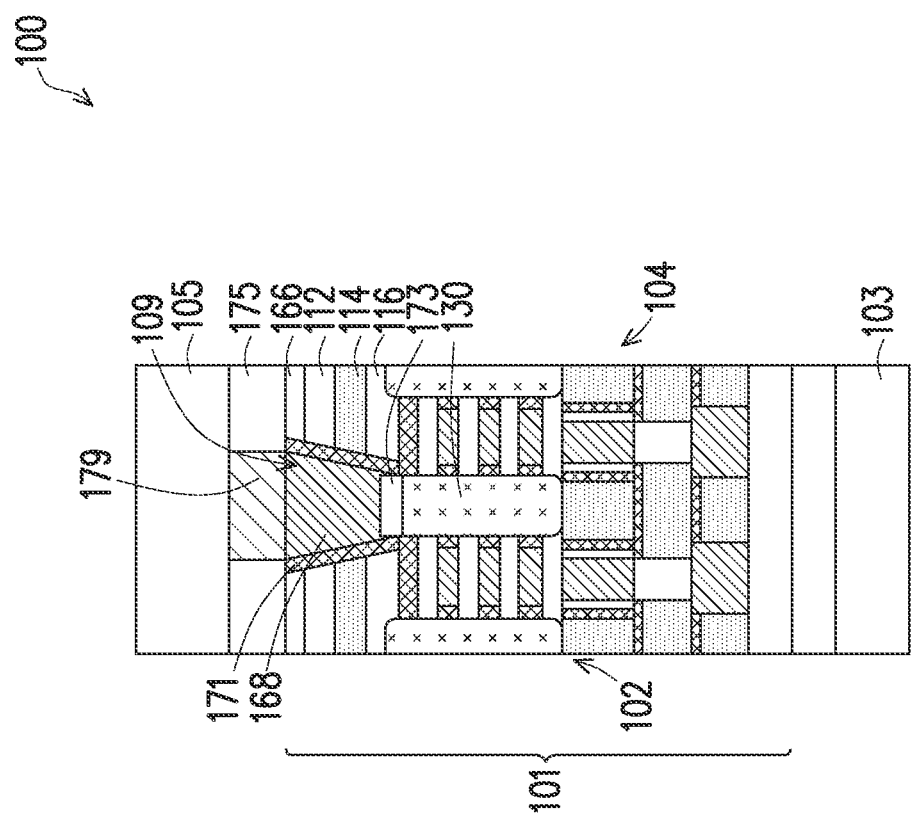
Figure 2M:
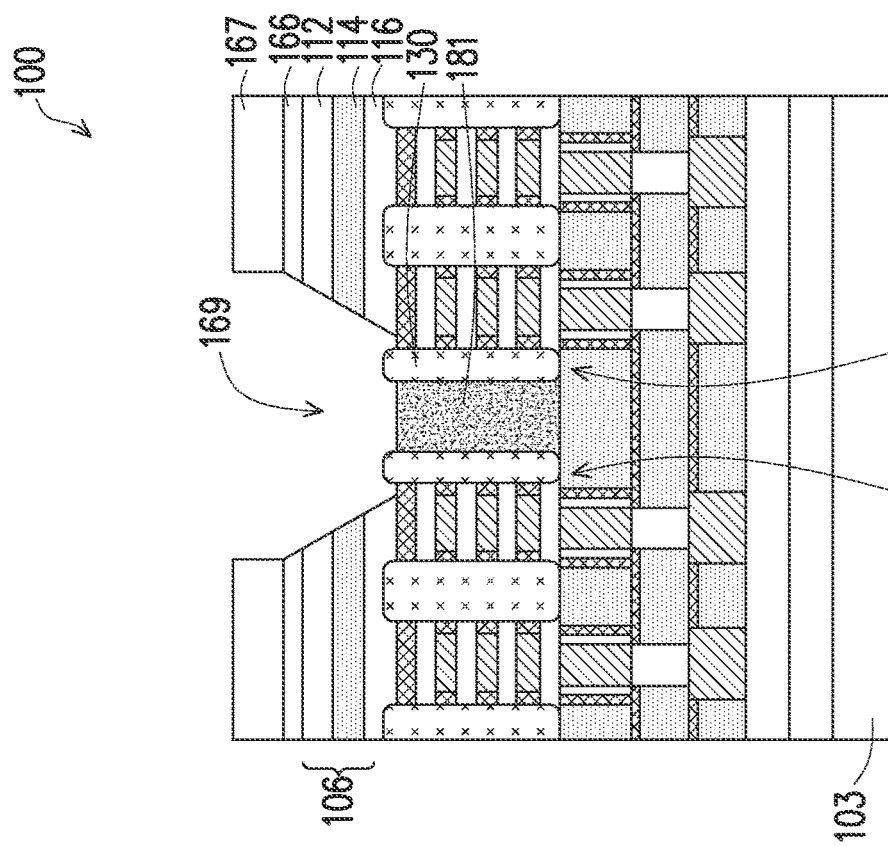
Figure 2L:
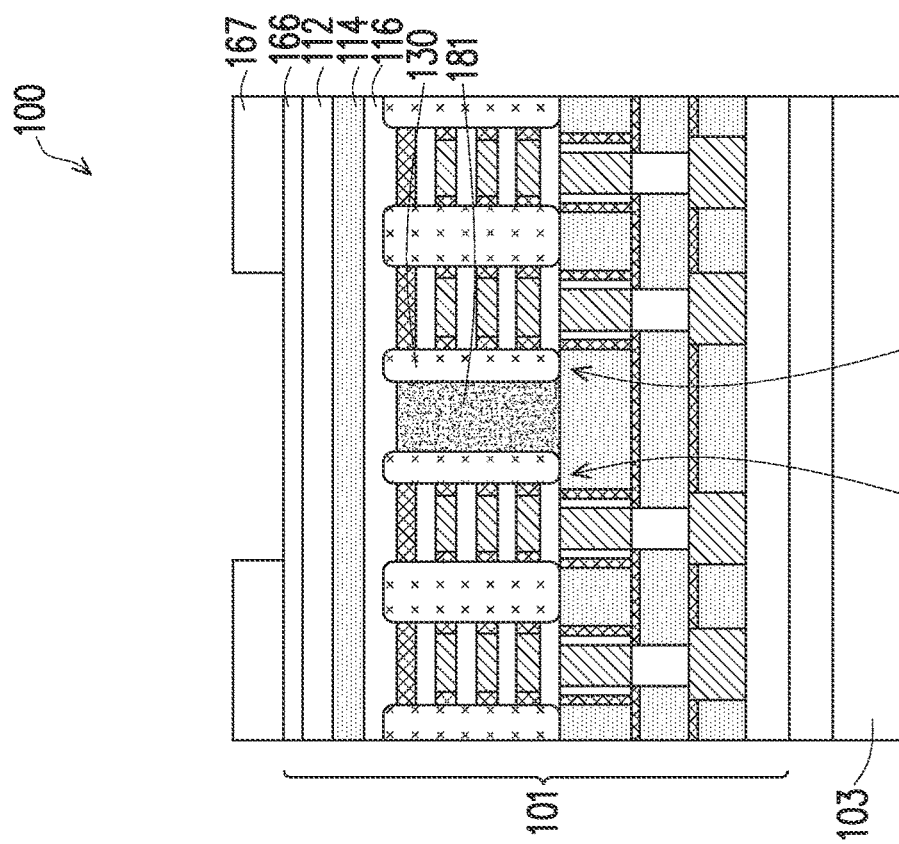
Figure 2O:
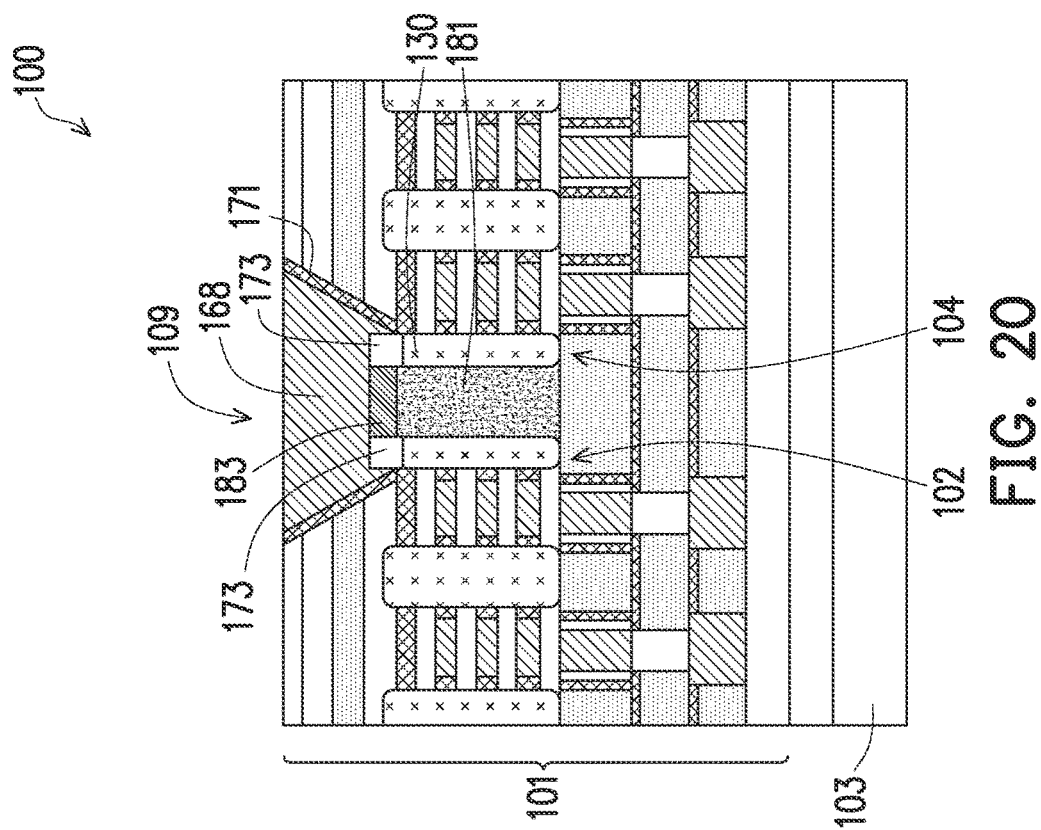
Figure 2N:
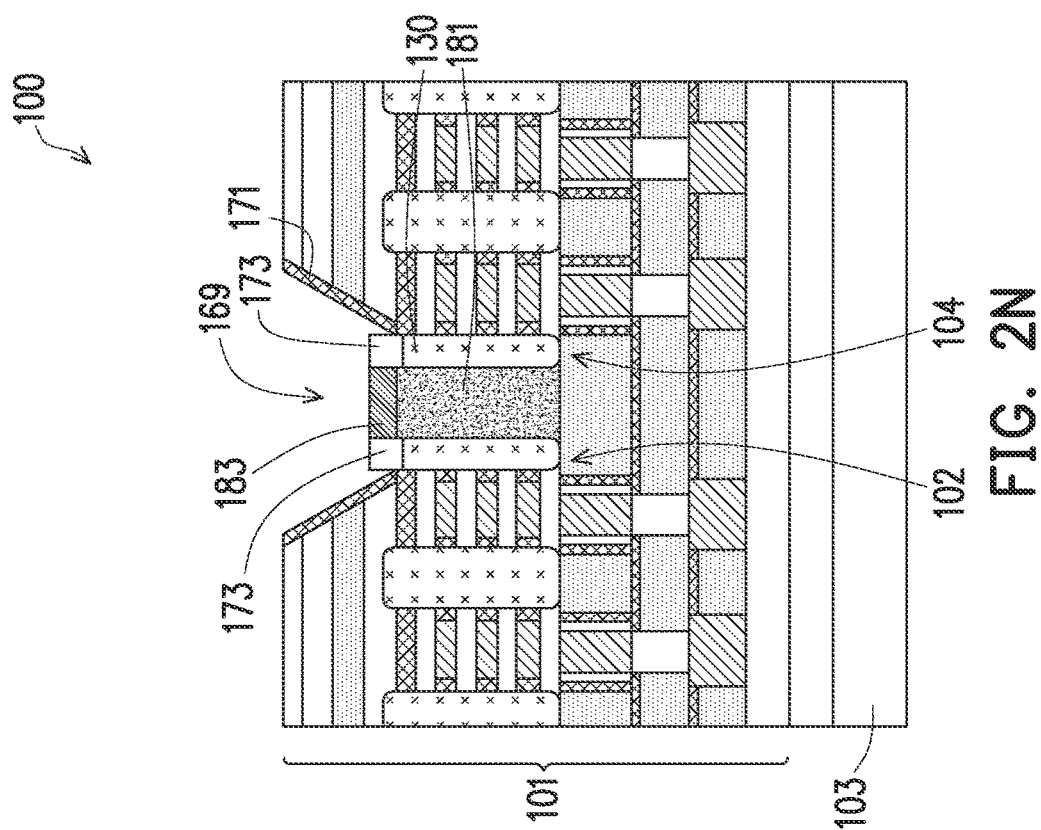
Figure 2P:
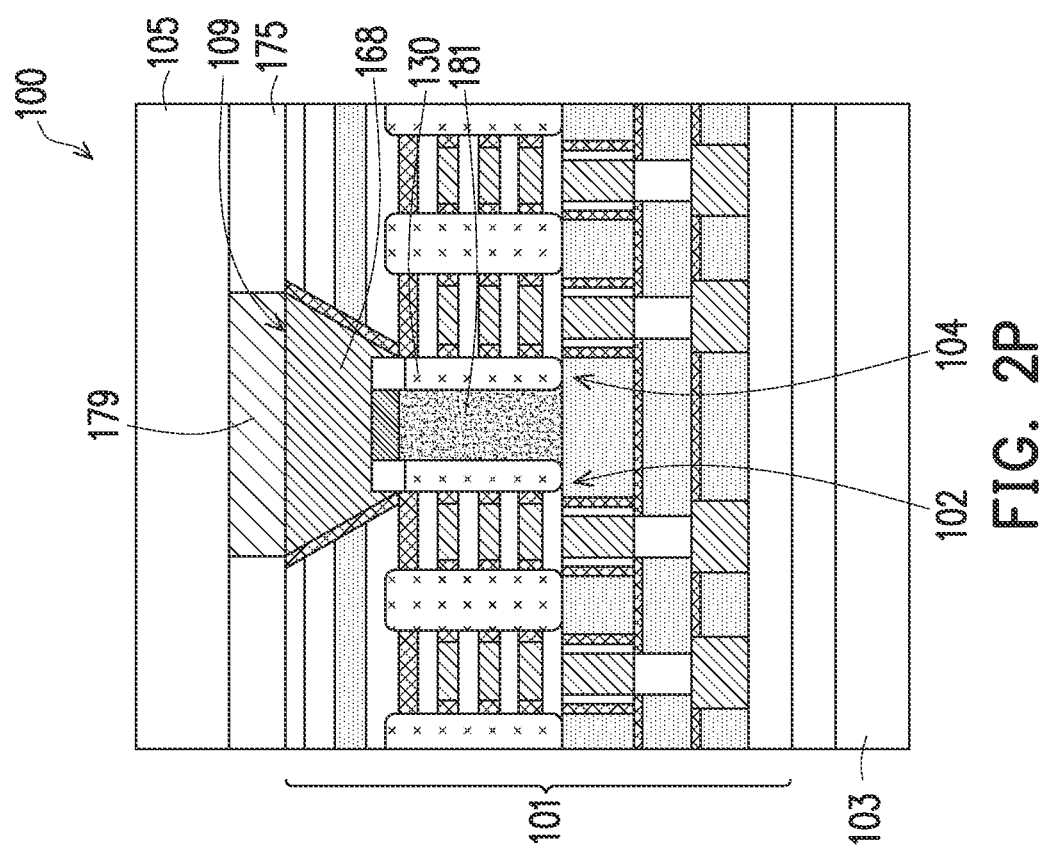

FIGS. 2A-2P are cross-sectional views of an integrated circuit 100 at various stages of processing, according to some embodiments. FIGS. 2A-2P illustrate one example of a process for forming the integrated circuit 100 of FIG. 1. More particularly, FIGS. 2A-2P illustrate an exemplary process for producing an integrated circuit 100 includes logic transistors in a first wafer and bonding the first wafer to a second wafer that includes electronic circuitry electrically connected to the logic transistors. FIGS. 2A-2P illustrate how the integrated circuit 100 can be formed in a simple and effective process in accordance with principles of the present disclosure. Other process steps and combinations of process steps can be utilized without departing from the scope of the present disclosure.

FIG. 2A is a cross-sectional diagram of an integrated circuit 100 at an intermediate stage of processing, according to some embodiments. In FIG. 2A, the integrated circuit 100 includes a first wafer 101. As will be set forth in more detail below, gate all around transistors will be formed in the first wafer 101.

The first wafer 101 includes a semiconductor substrate 106. In the example of FIG. 2A, the semiconductor substrate 106 includes a first semiconductor layer 112, an etch-stop layer 114 on the first semiconductor layer 112, and a second semiconductor layer 116 on the etch-stop layer 112. In some embodiments, the first semiconductor layer 112 and the second semiconductor layer 116 include silicon. However, embodiments of the present disclosure are not limited thereto, and in various embodiments, the first and second semiconductor layers 112 and 116 may include any suitable semiconductor materials. The first semiconductor layer 112, the second semiconductor layer 116, and the etch-stop layer 114 can collectively act as a semiconductor substrate 106.

In some embodiments, the semiconductor substrate 106 is in SOI substrate. In this case, the etch-stop layer 114 can include silicon dioxide or another dielectric. The material of the etch-stop layer 114 is selected such that the first and second semiconductor layers 112 and 116 are selectively etchable with respect to the etch-stop layer 114. The etch-stop layer 114 is also selectively etchable with respect to the first and second semiconductor layers 112 of 116.

In some embodiments, the etch-stop layer 114 is a semiconductor material. The semiconductor material of the etch-stop layer 114 is selected such that that the first and second semiconductor layers 112 and 116 are selectively etchable with respect to the etch-stop layer 114. The etch-stop layer 114 is also selectively etchable with respect to the first and second semiconductor layers 112 of 116.

The semiconductor substrate 106 can include different numbers of layers in different semiconductor materials than those shown in FIG. 2A and described above without departing from the scope of the present disclosure. The semiconductor substrate 106 can include various doped regions including N-type and P-type dopants. N-type dopants can include phosphorus. P-type dopants can include boron. Other types of dopants can be utilized without departing from the scope of the present disclosure.

The first semiconductor layer 112 is very thick compared to the etch-stop layer 114 and the second semiconductor layer 116. For example, the first semiconductor layer may have an initial thickness between 10 μm and 700 μm. Commonly, the first semiconductor layer 112 may have an initial thickness greater than 500 μm. The etch-stop layer 114 and the second semiconductor layer 116 may each have thicknesses between 30 nm and 500 nm. As will be set forth in more detail below, in subsequent steps the first semiconductor layer 112 may be entirely or mostly etched away. The presence of the etch-stop layer 114 helps to prevent damage to other sensitive structures during etching of the first semiconductor layer 112.

In FIG. 2B, a first transistor 102 and a second transistor 104 have been formed over the semiconductor substrate 106. The first transistor 102 and the second transistor 104 have the same types of structures and share a source/drain terminal. Accordingly, while reference numbers are provided primarily for the structures of the first transistor 102, the second transistor 104 has identical or comparable structures.

The first transistor 102 is a gate all around transistor. The transistor 102 includes a plurality of semiconductor nanosheets 120 or nanowires. The semiconductor nanosheets 120 are layers of semiconductor material. The semiconductor nanosheets 120 correspond to the channel regions of the transistor 102. The semiconductor nanosheets 120 are formed over the substrate 106, and may be formed on the semiconductor substrate 106. The semiconductor nanosheets 120 may include one or more layers of Si, Ge, SiGe, GaAs, InSb, GaP, GaSb, InAlAs, InGaAs, GaSbP, GaAsSb or InP. In some embodiments, the semiconductor nanosheets 120 are the same semiconductor material as the second semiconductor layer 116. Other semiconductor materials can be utilized for the semiconductor nanosheets 120 without departing from the scope of the present disclosure.

In some embodiments, the semiconductor nanosheets 120 are formed by alternating epitaxial growth processes from the second semiconductor layer 116. For example, a first epitaxial growth process may result in the formation a sacrificial semiconductor nanosheet on the top surface of the second semiconductor layer 116. A second epitaxial growth process may result in the formation of a semiconductor nanosheet 120 on the sacrificial semiconductor nanosheet. Alternating epitaxial growth processes are performed until a selected number of semiconductor nanosheets 120 and sacrificial semiconductor nanosheets have been formed.

After formation of the semiconductor nanosheets 120 and the sacrificial nanosheets between the semiconductor nanosheets 120, the sacrificial nanosheets are removed. Removal of the sacrificial nanosheets results in gaps between the semiconductor nanosheets 120.

In FIG. 2B, the transistor 102 has four semiconductor nanosheets 120. However, in practice, the transistor 102 may have other numbers of semiconductor nanosheets 120 than four. For example, the transistor 102 may include between 3 and 20 semiconductor nanosheets 120 in some embodiments. Other numbers of semiconductor nanosheets 120 can be utilized without departing from the scope of the present disclosure.

The semiconductor nanosheets 120 can have thicknesses between 2 nm and 100 nm. In some embodiments, the semiconductor nanosheets 120 have thicknesses between 2 nm and 20 nm. This range provides suitable conductivity through the semiconductor nanosheets while retaining a low thickness. In some embodiments, each nanosheet 120 is thicker than the semiconductor nanosheet(s) 120 above it. The semiconductor nanosheets 120 can have other thicknesses without departing from the scope of the present disclosure.

In some embodiments, a bottom dielectric layer 131 may be positioned between the bottom semiconductor nanosheet 120 and the second semiconductor layer 116. The bottom dielectric layer 131 may include silicon nitride or another suitable material.

A sheet inner spacer layer 128 is located between the semiconductor nanosheets 120. The sheet inner spacer layer 128 can be deposited by an ALD process, a CVD process, or other suitable processes. In one example, the sheet inner spacer layer 128 includes silicon nitride.

The semiconductor nanosheets 120 extend between source and drain regions 130. The source and drain regions 130 include semiconductor material. The source and drain regions 130 can be grown epitaxially from the semiconductor nanosheets 120 or from the second semiconductor layer 116. The source and drain regions 130 can be doped with N-type dopants species in the case of N-type transistors. The source and drain regions 130 can be doped with P-type dopant species in the case of P-type transistors. The doping can be performed in-situ during the epitaxial growth. While the source and drain regions 130 are labeled with a common reference number and title, in practice, the transistor 102 will have a source region and a drain region. For example, the region 130 on the left of the transistor 102 may correspond to a source of the transistor 102 and the region 130 on the right of the transistor 102 may correspond to a drain of the transistor 102. Alternatively, the drain may be on the left and the source may be on the right.

An interlevel dielectric layer 132 is positioned above the source and drain regions 130. The interlevel dielectric layer 132 can include silicon oxide. The interlevel dielectric layer 132 can be deposited by CVD, ALD, or other suitable processes. Other materials and processes can be utilized for the interlevel dielectric layer 132 without departing from the scope of the present disclosure.

A gate spacer 126 is positioned on sidewalls of a gate electrode trench formed in the interlevel dielectric layer 132 above the semiconductor nanosheets 120. The gate spacer 126 includes SiCON in some embodiments. The gate spacer 126 can be deposited by CVD, PVD, or ALD. Other materials and deposition processes can be utilized for the gate spacer 126 without departing from the scope of the present disclosure.

Though not shown in FIG. 2B, a thin interfacial dielectric layer is formed on the surfaces of the semiconductor nanosheets 120. The interfacial dielectric layer can include a dielectric material such as silicon oxide, silicon nitride, or other suitable dielectric materials. The interfacial dielectric layer can be formed by a thermal oxidation process, a CVD process, or an ALD process. The interfacial dielectric layer can have a thickness between 0.5 nm and 2 nm. Other materials, deposition processes, and thicknesses can be utilized for the interfacial dielectric layer without departing from the scope of the present disclosure.

The interfacial dielectric layer surrounds the semiconductor nanosheets 120. In particular, the semiconductor nanosheets 120 have a shape corresponding to a slat or wire extending between the source and drain regions 130. The interfacial dielectric layer wraps around each semiconductor nanosheet 120. The interfacial dielectric layer surrounds or partially surrounds the semiconductor nanosheets 120.

Though not shown in FIG. 2B, a high-K gate dielectric layer is formed on the interfacial dielectric layer, on the sidewalls of the gate spacers 126, and on the sidewalls of the sheet inner spacers 128. Together, the high-K gate dielectric layer and the interfacial dielectric layer correspond to a gate dielectric of the transistor 102. The high-K dielectric layer surrounds or partially surrounds the semiconductor nanosheets 120 in the same way as described in relation to the interfacial dielectric layer, except that the interfacial dielectric layer is between the semiconductor nanosheets 120 and the high-K gate dielectric layer.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In some embodiments, the high-K gate dielectric layer is formed using a highly conformal deposition process such as ALD in order to ensure the formation of a gate dielectric layer having a uniform thickness around each semiconductor nanosheet 120. In some embodiments, the thickness of the high-k dielectric layer is in a range from about 1 nm to about 4 nm. Other thicknesses, deposition processes, and materials can be utilized for the high-K gate dielectric layer without departing from the scope of the present disclosure.

A gate electrode 148 fills the remaining space between the semiconductor nanosheets 120 and the trench above the semiconductor nanosheets 120 between the gate spacers 126. The gate electrode 148 may include multiple individual layers of gate metals. The materials and thicknesses of the various layers of gate metals can be selected to provide a desired threshold voltage of the transistor 102. The gate electrode 148 can include a layer of TiN 140 lining the gate spacers 126 and covering the gate dielectric on the semiconductor nanosheets 120.

The gate electrode 148 includes a metal layer 140 and a gate fill material 146 positioned on the metal layer 140 in the trench and between semiconductor nanosheets 120. In one example, the gate fill material 146 includes tungsten. The gate fill material 146 can be deposited using PVD, ALD, CVD, or, other suitable deposition processes. The gate fill material 146 fills the remaining space in the trench and between semiconductor nanosheets 120. The gate fill material is highly conductive.

The metal layer 140 and the gate fill material 146 surround or partially surround the semiconductor nanosheets 120 in the same way as described above in relation to the interfacial dielectric layer and the high-K gate dielectric layer, except that the interfacial dielectric layer and the high-K gate dielectric layer are positioned between the semiconductor nanosheets 120 and the metal layer 140 and gate fill material 146.

In FIG. 2C, a dielectric layer 150 has been formed on the interlevel dielectric layer 132. The dielectric layer 150 can include silicon nitride or other types of dielectric material. The dielectric layer 150 can be deposited by CVD, PVD, or ALD. An interlevel dielectric layer 152 has been deposited on the dielectric layer 150. The interlevel dielectric layer 152 can include silicon oxide. The interlevel dielectric layer 152 can be deposited by CVD, ALD, or other suitable processes. Other materials and processes can be utilized for the interlevel dielectric layer 152 without departing from the scope of the present disclosure.

A contact plug 154 has been formed in the interlevel dielectric layer 152. The contact plug 154 is in electrical contact with the gate electrode 148 of the transistor 102. The contact plugs 154 can include tungsten or another suitable conductive material.

A dielectric layer 156 has been formed on the interlevel dielectric layer 152. The dielectric layer 156 can include silicon nitride or other types of dielectric material. The dielectric layer 156 can be deposited by CVD, PVD, or ALD. An interlevel dielectric layer 158 has been deposited on the dielectric layer 150. The interlevel dielectric layer 158 can include silicon oxide. The interlevel dielectric layer 158 can be deposited by CVD, ALD, or other suitable processes. Other materials and processes can be utilized for the interlevel dielectric layer 158 without departing from the scope of the present disclosure.

A metal line 160 has been formed in the interlevel dielectric layer 158. The metal line 160 is in contact with the contact plugs 154. The metal line 160 can include copper or other suitable conductive materials.

A bonding dielectric layer 162 has been deposited on the dielectric layer 158 and on the signal line 160. The bonding dielectric layer 162 is utilized to bond the first wafer 101 to a carrier wafer, as will be described in more detail below. The bonding dielectric layer 162 can include silicon oxide. The bonding layer 162 can be formed by high density plasma deposition and may, thus, be called a high density plasma oxide. The bonding dielectric layer 162 can include other materials and deposition processes without departing from the scope of the present disclosure.

After depositing the bonding dielectric layer 162, a chemical mechanical planarization (CMP) process is performed on the bonding dielectric layer 162. The CMP process is performed to prepare the wafer 101 for a wafer bonding process, as will be set forth in more detail below.

The wafer 101 may include many more levels of interlevel dielectric layers, conductive plugs, and metal lines than are shown in FIG. 2C. The bonding dielectric layer 162 may be formed on the last interlevel dielectric layer.

As set forth herein, the wafer 101 can be said to have a front-end and a backend. Traditionally, the backend corresponds to the bulk semiconductor substrate. In this case, the substrate 106 can be referred to as the backend or backside of the first wafer 101. The side of the wafer 101 in which the bonding dielectric layer 164 is positioned can be referred to as the front-end or front side of the wafer 103.

In FIG. 2D, a carrier wafer 103 has been bonded to the first wafer 101. A bonding dielectric layer 164 may be formed on the carrier wafer 103. Alternatively, the bonding dielectric layer 164 may be part of the carrier wafer 103. The bonding dielectric layer 164 may undergo a CMP process prior to bonding the carrier wafer 103 to the first wafer 101. Bonding the carrier wafer 103 to the first wafer 101 can include bonding the bonding dielectric layer 164 to the bonding dielectric layer 162. The carrier wafer 103 may include a semiconductor material. In some embodiments, the carrier wafer 103 includes silicon. The carrier wafer 103 may include a silicon on insulator (SOI) structure. The carrier wafer enables flipping of the first wafer 101 so that additional structures may be formed on the backside or backend of the first wafer 101, as will be set forth in more detail below.

The wafer bonding process can include performing a thermal annealing process after the bonding dielectric layer 162 is brought into contact with the bonding dielectric layer 164. The thermal annealing process may cause functional groups at the surfaces of the bonding dielectric layer 162 or 164 to bond together. For example, the functional groups may include OH. The bonding process results in formation of a SiO2 in place of the functional groups. Alternatively, other types of wafer bonding processes can be performed. Other techniques can include direct bonding, surface activated bonding, anode bonding, eutectic bonding, reactive bonding, or other suitable bonding processes. The result of the wafer bonding process is that the first wafer 101 is bonded to the carrier wafer 103.

In FIG. 2E, the integrated circuit 100 has been flipped with respect to the position shown in FIGS. 2A-2D. The carrier wafer 103 is now on the bottom. The backend of the first wafer 101, in particular the first semiconductor layer 112, is now on the top. This position allows for further processes to be performed on the backend of the wafer 101. As will be set forth in more detail below, the further processes include forming backside conductive vias.

In FIG. 2F, an etching process has been performed to reduce the thickness of the first semiconductor layer 112. As described previously, the first semiconductor layer 112 may be hundreds of μm thick. If backside conductive vias are formed through the first semiconductor layer 112 while the first semiconductor layer 112 is hundreds of micrometers thick, then the backside conductive vias may have a relatively high resistance and may utilize a large amount of expensive conductive material. Accordingly, prior to forming the backside conductive vias, an etching process is performed to reduce the thickness of the first semiconductor layer 112.

Due to the length of the etching process, it is possible that over-etching can occur in some locations and the source and drain regions 130 and the semiconductor nanosheets 120 can be damaged. The etch-stop layer 114 helps ensure that such over-etching does not occur. This is because the etching process selectively etches the first semiconductor layer 112 with respect to the etch-stop layer 114. Accordingly, no over-etching occurs. In some embodiments, the first semiconductor layer 112 is initially more than 100 μm thick. The final thickness of the first semiconductor layer 112 is less than 10 μm. Such a final thickness may be sufficiently thin to provide a low resistance backside conductive via. In some embodiments, the remaining thickness of the first semiconductor layer 112 is between 0.5 μm and 6 μm. Other remaining thicknesses can be utilized without departing from the scope of the present disclosure.

In FIG. 2F, a dielectric layer 166 has been deposited on the remaining portion of the first semiconductor layer 112. The dielectric layer 166 can include SiCN and have a thickness between 50 nm and 100 nm. The dielectric layer 166 may also include silicon oxide on the SiCN. The dielectric layer 166 can be deposited via ALD, CVD, or PVD. Other thicknesses, materials, and deposition processes can be utilized without departing from the scope of the present disclosure.

In FIG. 2F, a layer of photoresist 167 has been formed on the dielectric layer 166. The layer of photoresist 167 has been patterned using photolithography processes. The pattern of the layer of photo resist 167 corresponds to the pattern of backside conductive vias to be formed in the semiconductor substrate 106.

In FIG. 2G, an opening 169 has been formed in the dielectric layer 166, the first semiconductor layer 112, the etch-stop layer 114, and the second semiconductor layer 116. The opening 169 exposes the joint source/drain region 130 of the transistors 102 and 104. The opening 169 can be formed by a combination of etching processes including one or more wet etches, one or more dry etches, or other etching processes. The combination of etching processes is selected to ensure that each layer of the semiconductor substrate 106 is etched to expose the source/drain region 130. The opening 169 may be termed an aperture, a trench, or a via. As used herein, a via may correspond to an opening that has not yet been filled with the conductive material. A conductive via may correspond to an opening that has been filled with a conductive material. In FIG. 2H, the layer of photoresist 167 has been removed.

In FIG. 2I, a dielectric liner 171 has been formed on the sidewalls of the opening 169. The dielectric liner 171 can include silicon nitride, SiC, SiCN, or other suitable materials. The dielectric liner 171 can be deposited via ALD, CVD, PVD, or other suitable processes. The dielectric liner 171 can include other materials and deposition processes without departing from the scope of the present disclosure.

In FIG. 2J, a silicide 173 has been formed on the exposed source/drain regions 130. The silicide 173 service as an electrical contact to the semiconductor material of the source/drain region 130. The silicide 173 can be formed by depositing titanium and titanium nitride and then performing the thermal annealing process. The silicide 173 can include TiSi, CoSi, NiSi, TaSi, PtSl, WSi, MoSi, or CuSi. After the thermal annealing process has been completed, the silicide 173 has been formed. In this case, the silicide 173 is titanium silicide. Other processes and materials can be utilized to form the silicide 173 without departing from the scope of the present disclosure.

In FIG. 2J, a backside conductive via 109 has been completed. In particular, a conductive plug 168 has been formed in the opening 169. The conductive plug 168 fills the opening 169. The conductive plug 168 is in contact with the silicide 173. The conductive plug 168 can include Co, W, Al, Cu, Mo, Ru. Ir, Au, Ag, Sn, Ni, Fe, $RuO_2$, $IrO_2$, Ti, TiAl, Pt, or other suitable materials. The conductive plug 168 can be deposited by PVD, ALD, CVD, or other suitable processes.

In FIG. 2K, a second wafer 105 has been bonded to the first wafer 101. The second wafer 105 can include electronic circuitry 111 (see FIG. 1). The electronic circuitry 111 can include a memory array, sensor circuitry, or other types of electronic circuitry. The second wafer 105 includes a bonding dielectric layer 175. The metal structure 179 is formed in the bonding dielectric layer 175. The metal structure 179 is in electrical contact with the backside conductive via 109 of the first wafer 101. The metal structure 179 and the backside conductive via 109 electrically connects the transistors 102 and 104 of the first wafer 101 to the electronic circuitry 111 of the second wafer 105. In practice, the bonding dielectric layer 175 and the metal structure 179 are part of the second wafer 105.

The dielectric layer 166 can correspond to or can include a bonding dielectric layer. Accordingly, the first wafer 101 is bonded to the second wafer 105 by bonding the dielectric layer 166 to the bonding dielectric layer 175 of the second wafer 105. The bonding process can include performing a thermal annealing process as described in relation to FIG. 2D. Other processes and materials can be utilized for bonding the second wafer 105 to the first wafer 101 without departing from the scope of the present disclosure.

FIGS. 2L-2P illustrate forming a backside conductive via 109 connecting to a slightly different transistor structure. The stage of processing in FIG. 2L corresponds to the stage of processing of FIG. 2F. However, in the example of FIG. 2L, a shallow trench isolation 181 separates a source/drain region 130 of the transistor 102 from the source/drain region 130 of the transistor 104. The shallow trench isolation can include silicon oxide or other suitable dielectric materials. Accordingly, in this case, the transistor 102 and the transistor 104 do not share a source/drain region 130.

In FIG. 2M, the opening 169 has been formed in the dielectric layer 166 and then the layers of the semiconductor substrate 106. The opening 169 exposes the source/drain region 130 of the transistor 102, the source/drain region 130 of the transistor 104, and the shallow trench isolation 181.

In FIG. 2N, the dielectric liner 171 has been deposited on the sidewalls of the opening 169. The silicide 173 has been formed on the source/drain regions 130 of the transistors 102 and 104. A metal nitride layer 183 has been formed on the shallow trench isolation 181. The metal nitride layer can include the same metal as the silicide 173 bonded with silicon nitride of the shallow trench isolation 181. The metal nitride layer 183 can have other materials based on the material of the shallow trench isolation 181 and the material used to form the silicide 173.

In FIG. 2O, the backside conductive via 109 has been completed by forming the conductive plugs 168 in the opening 169. The conductive plugs 168 is in electrical contact with the silicides 173 of the source and drain regions 130 of both the transistor 102 of the transistor 104. Accordingly, the backside conductive via 109 electrically connects the transistor 102 to the transistor 104.

In FIG. 2P, the second wafer 105 has been bonded to the first wafer 101. The second wafer 105 includes the bonding dielectric layer 175 and the metal structure 179 in electrical contact with the backside conductive via 109.

Although FIGS. 1-2P have disclosed backside conductive vias 109, the integrated circuit can also include backside metal lines or metal slots formed in the same manner as the backside conductive vias 109.

FIGS. 3A-3H illustrate a process for forming a backside conductive via 109 and bonding the first wafer 101 to a second wafer 105, in accordance with some embodiments. FIGS. 3A-3H illustrate one example of a process for forming the integrated circuit 100 of FIG. 1. The view of FIG. 3A corresponds to the same stage of processing as FIG. 2E.

Figure 3B:
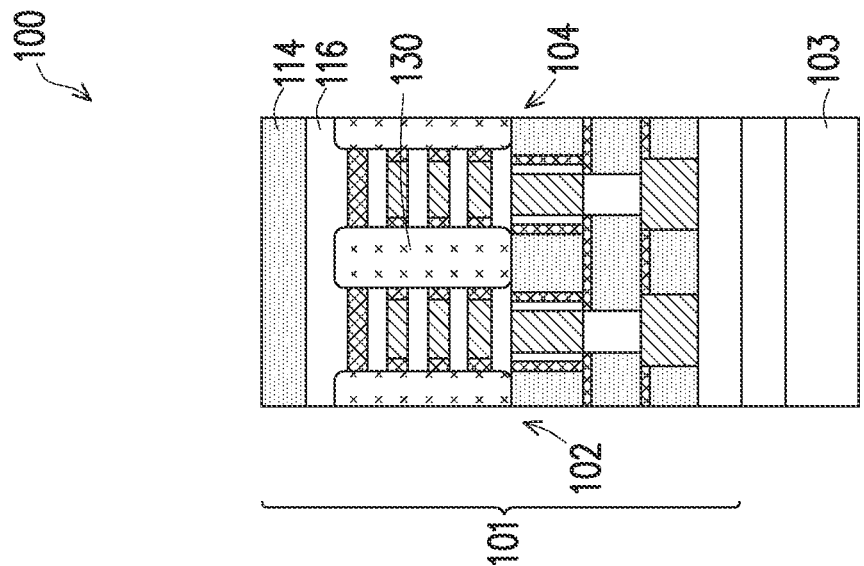
Figure 3A:
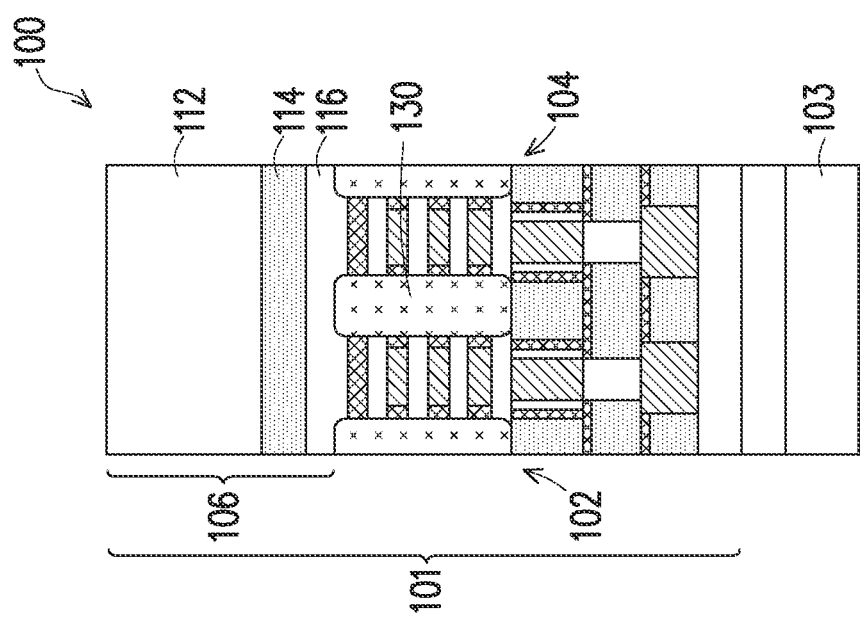

In FIG. 3B, the first semiconductor layer 112 has been entirely removed. The first semiconductor layer 112 can be removed by one or more processes including a wet etch, a dry etch, and a grinding process. The etching process stops at the etch-stop layer 114. This is because the material of the first semiconductor layer 112 is selectively etchable with respect to the material of the etch-stop layer 114. The presence of the etch-stop layer 114 prevents over-etching that could damage the transistors 102 and 104. The presence of the etch-stop layer 114 enables the etching process of the semiconductor layer 112 to be performed more rapidly because tight control of process parameters is not needed to prevent over-etching.

Figure 3D:
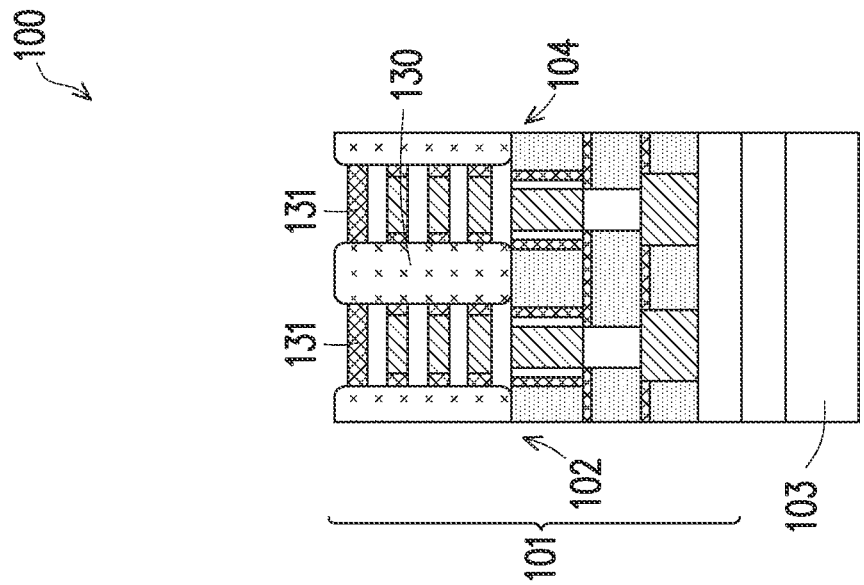
Figure 3C:
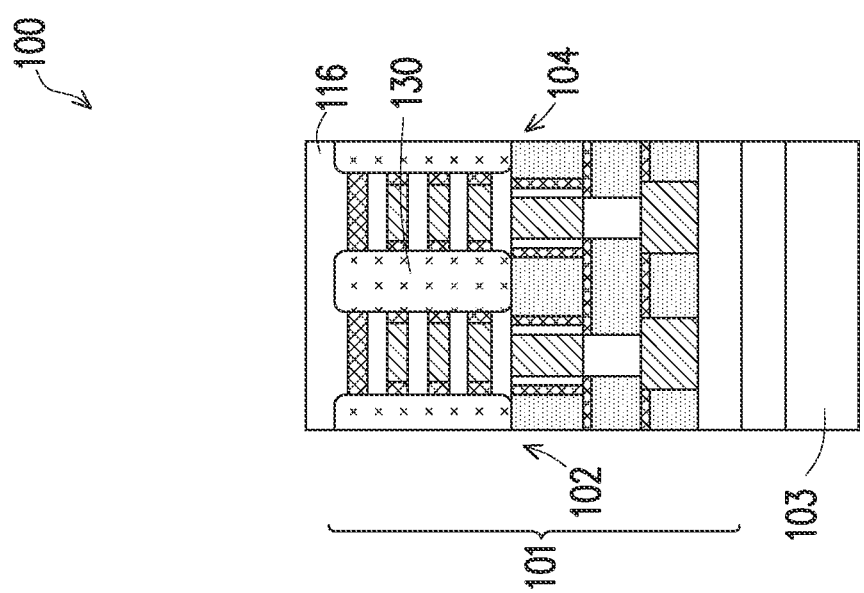

In FIG. 3C, the etch-stop layer 114 has been removed. The etch-stop layer 114 can be removed with an etching process that selectively etches the etch-stop layer 114 with respect to the second semiconductor layer 116. The etching process can include one or more of a wet etch or a dry etch.

In FIG. 3D, the second semiconductor layer 112 has been removed. The second semiconductor layer 112 can be removed by an etching process including one from more of a wet etch of a dry etch. Because the second semiconductor layer 112 is relatively thin, the second semiconductor layer 112 can be entirely removed without the risk of large etching variations at certain locations that could damage the transistors 102 and 104. A timed etch is sufficient to remove the semiconductor layer 112 without risk of damaging the transistors 102 and 104.

Figure 3F:
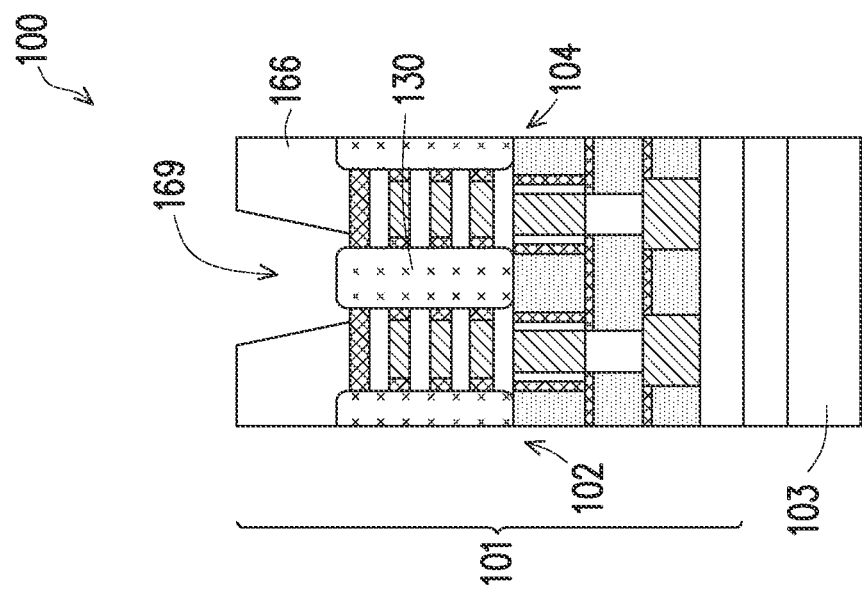
Figure 3E:
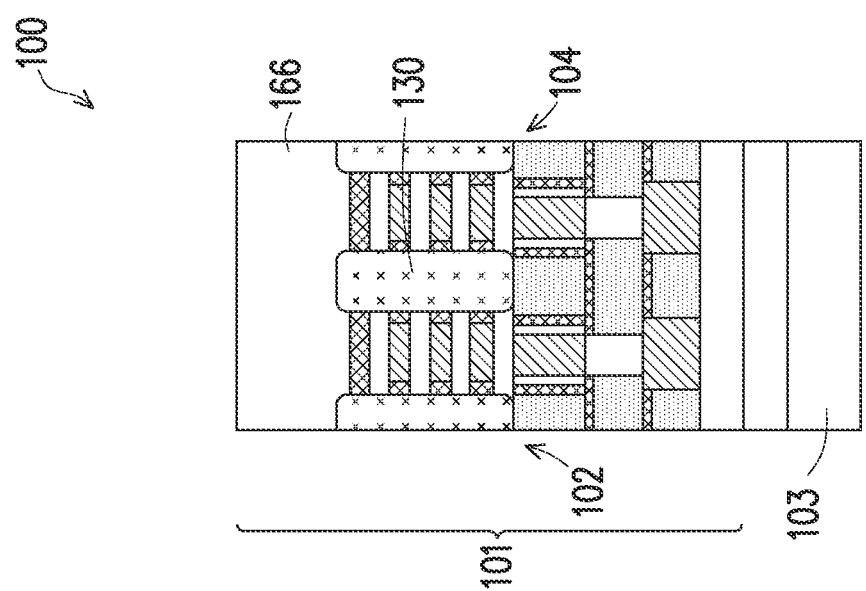

In FIG. 3E, the dielectric layer 166 has been deposited. The dielectric layer 166 can include a combination of SiCN and silicon oxide layers. In particular, a layer of SiCN can first be deposited followed by a high plasma density deposition of silicon oxide. In this way, the dielectric layer 166 can act as a bonding dielectric layer. The dielectric layer 166 can have a thickness between 100 nm and 5 μm. Other processes, thicknesses, and materials can be utilized for the dielectric layer 166 without departing from the scope of the present disclosure.

In FIG. 3F, the opening 169 has been formed in the dielectric layer 166. Though not shown in FIG. 3F, the opening 169 can be formed by depositing and patterning the photoresist 167. Accordingly, the opening 169 can be etched in the presence of the patterned photoresist 167 as described previously. The opening 169 exposes the joint source/drain region 130 of the transistors 102 and 104.

In FIG. 3G, the backside conductive via 109 has been formed. The backside conductive via 109 is formed by depositing the dielectric liner 179 on the sidewalls of the opening 169, forming the silicide 173 on the source/drain region 130, and forming the conductive plugs 168 in the opening 169 as described previously. In this case, the backside conductive via 109 can be considered a through-dielectric via.

In FIG. 3H, the second wafer 105 has been bonded to the first wafer 101 in the same manner as described previously. The metal structure 179 of the bonding dielectric layer 175 is an physical and electrical contact with the backside conductive via 109.

Figure 4:
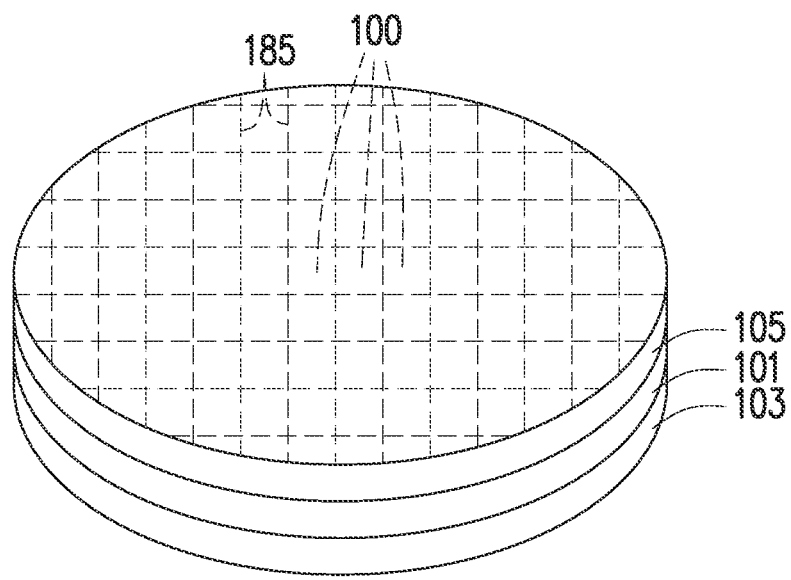
FIG. 4 is an illustration of multiple wafers bonded together, in accordant with some embodiments.

FIG. 4 illustrates the first wafer 101 bonded to the carrier wafer 103 and the second wafer 105, in accordance with some embodiments. The view of FIG. 2 illustrates the bonded wafers prior to dicing. Dicing lines 185 are shown on the second wafer 105. The dicing lines indicate how the bonded wafers will be diced into individual integrated circuits 100. Each individual integrated circuit 100 includes logic transistors 107, backside vias 109, and electrical circuitry 111. After the integrated circuits have been diced from the wafers 101 and 103, the integrated circuits 100 may be coupled to lead frames or other substrates and encapsulated in integrated circuit packages. Various dicing and packaging techniques, components, and systems can be utilized for the integrated circuits 100 without departing from the scope of the present disclosure.

Figure 5A:
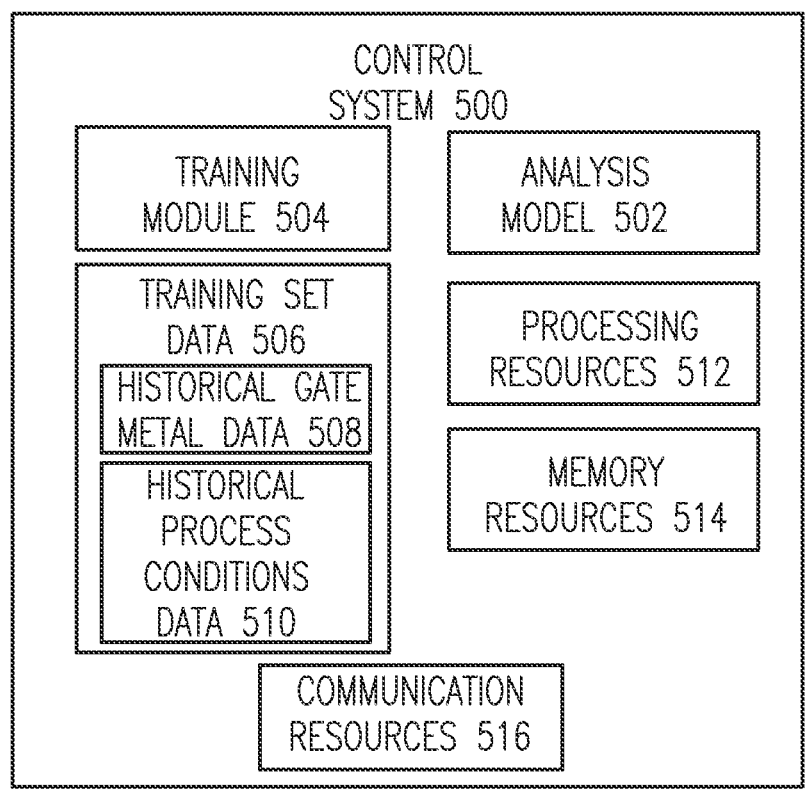
FIG. 5A is a block diagram of a control system of a semiconductor process system, according to some embodiments.

FIG. 5A is a block diagram of a control system 500 for controlling an atomic layer etching (ALE) process, according to some embodiments. The control system 500 of FIG. 5A is configured to control operation of an ALE etching system in performing ALE processes to form aspects of the integrated circuits 100 of FIGS. 1-4, according to some embodiments. In some embodiments, controls system 500 is utilized to control an ALE process for forming the metal layers of the gate electrode 148 of the transistor 102 as described in relation to FIG. 2B. In particular, the ALE process can be utilized for tightly controlling the thickness and the height of the metal layer 140 of the gate electrode 148, or other metal layers and the gate electrode 148.

Figure 5B:
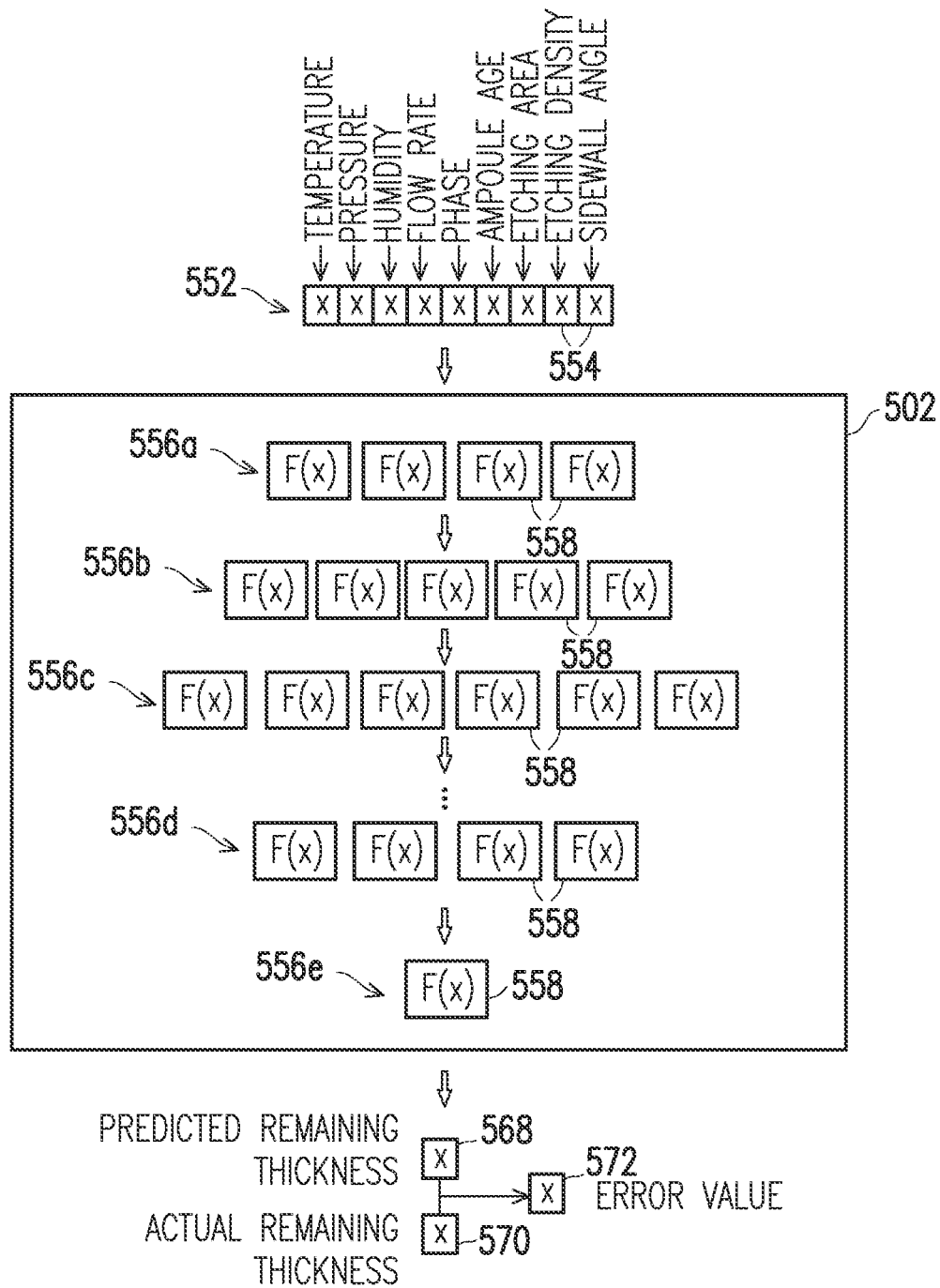
FIG. 5B is a block diagram of an analysis model, according to some embodiments.

While the description of FIGS. 5A and 5B is directed primarily to controlled etching of layers of the gate electrode 148, the controlled etching process can also be used to pattern other thin-films. For example, the controlled etching can be used to pattern the various gate dielectric layers or other layers associated with a gate all around transistor 102. Additionally, the controlled etching process can be utilized to remove or reduce the thickness of the layers of the semiconductor substrate 106.

The control system 500 utilizes machine learning to adjust parameters of the ALE system. The control system 500 can adjust parameters of the ALE system between ALE runs or even between ALE cycles in order to ensure that the gate metal or gate metals of the gate electrode 148 fall within selected specifications.

In some embodiments, the control system 500 includes an analysis model 502 and a training module 504. The training module trains the analysis model 502 with a machine learning process. The machine learning process trains the analysis model 502 to select parameters for an ALE process that will result in the gate electrode of the transistor 102 having selected characteristics. Although the training module 504 is shown as being separate from the analysis model 502, in practice, the training module 504 may be part of the analysis model 502.

The control system 500 includes, or stores, training set data 506. The training set data 506 includes historical gate metal data 508 and historical process conditions data 510. The historical gate metal data 508 includes data related to gate electrodes resulting from ALE processes. The historical process conditions data 510 includes data related to process conditions during the ALE processes that etched the gate metals. As will be set forth in more detail below, the training module 504 utilizes the historical gate metal data 508 and the historical process conditions data 510 to train the analysis model 502 with a machine learning process.

In some embodiments, the historical gate metal data 508 includes data related to the remaining thickness of previously etched gate metals. For example, during operation of a semiconductor fabrication facility, thousands or millions of semiconductor wafers may be processed over the course of several months or years. Each of the semiconductor wafers may include gate metals etched by ALE processes. After each ALE process, the thicknesses of the thin-films are measured as part of a quality control process. The historical gate metal data 508 includes the remaining thicknesses of each of the gate metals etched by ALE processes. Accordingly, the historical gate metal data 508 can include thickness data for a large number of thin-films etched by ALE processes.

In some embodiments, the historical gate metal data 508 may also include data related to the thickness of gate metals at intermediate stages of the thin-film etching processes. For example, an ALE process may include a large number of etching cycles during which individual layers of the gate metal are etched. The historical gate metal data 508 can include thickness data for gate metals after individual etching cycles or groups of etching cycles. Thus, the historical gate metal data 508 not only includes data related to the total thickness of a gate metal after completion of an ALE process, but may also include data related to the thickness of the gate metal at various stages of the ALE process.

In some embodiments, the historical gate metal data 508 includes data related to the composition of the remaining gate metals etched by ALE processes. After a gate metal is etched, measurements can be made to determine the elemental or molecular composition of the gate metals. Successful etching of the gate metals results in a gate metal that includes particular remaining thicknesses. Unsuccessful etching processes may result in a gate metal that does not include the specified proportions of elements or compounds. The historical gate metal data 508 can include data from measurements indicating the elements or compounds that make up the various gate metals.

In some embodiments, the historical process conditions 510 include various process conditions or parameters during ALE processes that etch the gate metals associated with the historical gate metal data 508. Accordingly, for each gate metal having data in the historical gate metal data 508, the historical process conditions data 510 can include the process conditions or parameters that were present during etching of the gate metal. For example, the historical process conditions data 510 can include data related to the pressure, temperature, and fluid flow rates within the process chamber during ALE processes.

The historical process conditions data 510 can include data related to remaining amounts of precursor material in the fluid sources during ALE processes. The historical process conditions data 510 can include data related to the age of the ALE etching chamber, the number of etching processes that have been performed in the ALE etching chamber, a number of etching processes that have been performed in the ALE etching chamber since the most recent cleaning cycle of the ALE etching chamber, or other data related to the ALE etching chamber. The historical process conditions data 510 can include data related to compounds or fluids introduced into the ALE etching chamber during the etching process. The data related to the compounds can include types of compounds, phases of compounds (solid, gas, or liquid), mixtures of compounds, or other aspects related to compounds or fluids introduced into the ALE etching chamber. The historical process conditions data 510 can include data related to the humidity within the ALE etching chamber during ALE processes. The historical process conditions data 510 can include data related to light absorption, light adsorption, and light reflection related to the ALE etching chamber. The historical process conditions data 510 can include data related to the length of pipes, tubes, or conduits that carry compounds or fluids into the ALE etching chamber during ALE processes. The historical process conditions data 510 can include data related to the condition of carrier gases that carry compounds or fluids into the ALE etching chamber during ALE processes.

In some embodiments, historical process conditions data 510 can include process conditions for each of a plurality of individual cycles of a single ALE process. Accordingly, the historical process conditions data 510 can include process conditions data for a very large number of ALE cycles.

In some embodiments, the training set data 506 links the historical gate metal data 508 with the historical process conditions data 510. In other words, the thin-film thickness, material composition, or crystal structure associated with a gate metal in the historical gate metal data 508 is linked to the process conditions data associated with that etching process. As will be set forth in more detail below, the labeled training set data can be utilized in a machine learning process to train the analysis model 502 to predict semiconductor process conditions that will result in properly formed gate metals.

In some embodiments, the control system 500 includes processing resources 512, memory resources 514, and communication resources 516. The processing resources 512 can include one or more controllers or processors. The processing resources 512 are configured to execute software instructions, process data, make thin-film etching control decisions, perform signal processing, read data from memory, write data to memory, and to perform other processing operations. The processing resources 512 can include physical processing resources 512 located at a site or facility of the ALE system. The processing resources can include virtual processing resources 512 remote from the site ALE system or a facility at which the ALE system is located. The processing resources 512 can include cloud-based processing resources including processors and servers accessed via one or more cloud computing platforms.

In some embodiments, the memory resources 514 can include one or more computer readable memories. The memory resources 514 are configured to store software instructions associated with the function of the control system and its components, including, but not limited to, the analysis model 502. The memory resources 514 can store data associated with the function of the control system 500 and its components. The data can include the training set data 506, current process conditions data, and any other data associated with the operation of the control system 500 or any of its components. The memory resources 514 can include physical memory resources located at the site or facility of the ALE system. The memory resources can include virtual memory resources located remotely from site or facility of the ALE system. The memory resources 514 can include cloud-based memory resources accessed via one or more cloud computing platforms.

In some embodiments, the communication resources can include resources that enable the control system 500 to communicate with equipment associated with the ALE system. For example, the communication resources 516 can include wired and wireless communication resources that enable the control system 500 to receive the sensor data associated with the ALE system and to control equipment of the ALE system. The communication resources 516 can enable the control system 500 to control the flow of fluids or other material from the fluid sources and from the purge sources. The communication resources 516 can enable the control system 500 to control heaters, voltage sources, valves, exhaust channels, wafer transfer equipment, and any other equipment associated with the ALE system. The communication resources 516 can enable the control system 500 to communicate with remote systems. The communication resources 516 can include, or can facilitate communication via, one or more networks such as wire networks, wireless networks, the Internet, or an intranet. The communication resources 516 can enable components of the control system 500 to communicate with each other.

In some embodiments, the analysis model 502 is implemented via the processing resources 512, the memory resources 514, and the communication resources 516. The control system 500 can be a dispersed control system with components and resources and locations remote from each other and from the ALE system.

FIG. 5B is a block diagram illustrating operational aspects and training aspects of the analysis model 502 of FIG. 5A, according to some embodiments. The analysis model 502 can be used to select parameters for ALE processes performed by the ALE system to form aspects the integrated circuits 100 of FIGS. 1-4. In some embodiments, the analysis model 502 of FIG. 5B is used to control an ALE process for forming individual gate metal layers of the gate electrode 148 described in relation to FIG. 1B.

While the description of the analysis model 502 is directed primarily to forming or patterning the gate metal, the analysis model 502 can be utilized to pattern other materials of the transistor 102 or the phase change memory element. For example, the analysis model 502 can control an ALE process for forming or patterning the metal layers associated with the gate electrode 148 and the top electrode 162.

As described previously, the training set data 506 includes data related to a plurality of previously performed gate metal etching processes. Each previously performed gate metal etching process took place with particular process conditions and resulted in a gate metal having a particular characteristics. The process conditions for each previously performed gate metal etching process are formatted into a respective process conditions vector 552. The process conditions vector includes a plurality of data fields 554. Each data field 554 corresponds to a particular process condition.

The example of FIG. 5B illustrates a single process conditions vector 552 that will be passed to the analysis model 502 during the training process. In the example of FIG. 5B, the process conditions vector 552 includes nine data fields 554. A first data field 554 corresponds to the temperature during the previously performed gate metal etching process. A second data field 556 corresponds to the pressure during the previously performed gate metal etching process. A third data field 554 corresponds to the humidity during the previously performed gate metal etching process. The fourth data field 554 corresponds to the flow rate of etching materials during the previously performed gate metal etching process. The fifth data field 554 corresponds to the phase (liquid, solid, or gas) of etching materials during the previously performed gate metal etching process. The sixth data field 554 corresponds to the age of the ampoule used in the previously performed gate metal etching process. The seventh data field 554 corresponds to a size of an etching area on a wafer during the previously performed gate metal etching process. The eighth data field 554 corresponds to the density of surface features of the wafer utilized during the previously performed gate metal etching process. The ninth data field corresponds to the angle of sidewalls of surface features during the previously performed gate metal etching process. In practice, each process conditions vector 552 can include more or fewer data fields than are shown in FIG. 5B without departing from the scope of the present disclosure. Each process conditions vector 552 can include different types of process conditions without departing from the scope of the present disclosure. The particular process conditions illustrated in FIG. 5B are given only by way of example. Each process condition is represented by a numerical value in the corresponding data field 554. For condition types that are not naturally represented in numbers, such as material phase, a number can be assigned to each possible phase.

The analysis model 502 includes a plurality of neural layers 556a-c. Each neural layer includes a plurality of nodes 558. Each node 558 can also be called a neuron. Each node 558 from the first neural layer 556a receives the data values for each data field from the process conditions vector 552. Accordingly, in the example of FIG. 5B, each node 558 from the first neural layer 556a receives nine data values because the process conditions vector 552 has nine data fields. Each neuron 558 includes a respective internal mathematical function labeled F(x) in FIG. 5B. Each node 558 of the first neural layer 556a generates a scalar value by applying the internal mathematical function F(x) to the data values from the data fields 554 of the process conditions vector 552. Further details regarding the internal mathematical functions F(x) are provided below.

Each node 558 of the second neural layer 556b receives the scalar values generated by each node 558 of the first neural layer 556a. Accordingly, in the example of FIG. 5B each node of the second neural layer 556b receives four scalar values because there are four nodes 558 in the first neural layer 556a. Each node 558 of the second neural layer 556b generates a scalar value by applying the respective internal mathematical function F(x) to the scalar values from the first neural layer 556a.

Each node 558 of the third neural layer 556c receives the scalar values generated by each node 558 of the second neural layer 556b. Accordingly, in the example of FIG. 5B each node of the third neural layer 556c receives five scalar values because there are five nodes 558 in the second neural layer 556b. Each node 558 of the third neural layer 556c generates a scalar value by applying the respective internal mathematical function F(x) to the scalar values from the nodes 558 of the second neural layer 556b.

Each node 558 of the neural layer 556d receives the scalar values generated by each node 558 of the previous neural layer (not shown). Each node 558 of the neural layer 556d generates a scalar value by applying the respective internal mathematical function F(x) to the scalar values from the nodes 558 of the previous neural layer.

The final neural layer includes only a single node 558. The final neural layer receives the scalar values generated by each node 558 of the previous neural layer 556d. The node 558 of the final neural layer 556e generates a data value 568 by applying a mathematical function F(x) to the scalar values received from the nodes 558 of the neural layer 556d.

In the example of FIG. 5B, the data value 568 corresponds to the predicted remaining thickness of a gate metal generated by process conditions data corresponding to values included in the process conditions vector 552. In other embodiments, the final neural layer 556c may generate multiple data values each corresponding to a particular gate metal characteristic such as gate metal crystal orientation, gate metal uniformity, or other characteristics of a gate metal. The final neural layer 556e will include a respective node 558 for each output data value to be generated. In the case of a predicted gate metal thickness, engineers can provide constraints that specify that the predicted gate metal thickness 568 must fall within a selected range, such as between 0 nm and 50 nm, in one example. The analysis model 502 will adjust internal functions F(x) to ensure that the data value 568 corresponding to the predicted gate metal thickness will fall within the specified range.

During the machine learning process, the analysis model compares the predicted remaining thickness in the data value 568 to the actual remaining thickness of the gate metal as indicated by the data value 570. As set forth previously, the training set data 506 includes, for each set of historical process conditions data, gate metal characteristics data indicating the characteristics of the gate metal that resulted from the historical gate metal etching process. Accordingly, the data value 570 includes the actual remaining thickness of the gate metal that resulted from the etching process reflected in the process conditions vector 552. The analysis model 502 compares the predicted remaining thickness from the data value 568 to the actual remaining thickness from the data value 570. The analysis model 502 generates an error value 572 indicating the error or difference between the predicted remaining thickness from the data value 568 and the actual remaining thickness from the data value 570. The error value 572 is utilized to train the analysis model 502.

The training of the analysis model 502 can be more fully understood by discussing the internal mathematical functions F(x). While all of the nodes 558 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_n + b.$$

In the equation above, each value $x_1$-$x_n$ corresponds to a data value received from a node 558 in the previous neural layer, or, in the case of the first neural layer 556a, each value $x_1$-$x_n$ corresponds to a respective data value from the data fields 554 of the process conditions vector 552. Accordingly, n for a given node is equal to the number of nodes in the previous neural layer. The values $w_1$-$w_n$ are scalar weighting values associated with a corresponding node from the previous layer. The analysis model 502 selects the values of the weighting values $w_1$-$w_n$. The constant b is a scalar biasing value and may also be multiplied by a weighting value. The value generated by a node 558 is based on the weighting values $w_1$-$w_n$. Accordingly, each node 558 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 572 has been calculated, the analysis model 502 adjusts the weighting values $w_1$-$w_n$ for the various nodes 558 of the various neural layers 556a-556e. After the analysis model 502 adjusts the weighting values $w_1$-$w_n$, the analysis model 502 again provides the process conditions vector 552 to the input neural layer 556a. Because the weighting values are different for the various nodes 558 of the analysis model 502, the predicted remaining thickness 568 will be different than in the previous iteration. The analysis model 502 again generates an error value 572 by comparing the actual remaining thickness 570 to the predicted remaining thickness 568.

The analysis model 502 again adjusts the weighting values $w_1$-$w_n$ associated with the various nodes 558. The analysis model 502 again processes the process conditions vector 552 and generates a predicted remaining thickness 568 and associated error value 572. The training process includes adjusting the weighting values $w_1$-$w_n$ in iterations until the error value 572 is minimized.

FIG. 5B illustrates a single process conditions vector 552 being passed to the analysis model 502. In practice, the training process includes passing a large number of process conditions vectors 552 through the analysis model 502, generating a predicted remaining thickness 568 for each process conditions vector 552, and generating associated error value 572 for each predicted remaining thickness. The training process can also include generating an aggregated error value indicating the average error for all the predicted remaining thicknesses for a batch of process conditions vectors 552. The analysis model 502 adjusts the weighting values $w_1$-$w_n$ after processing each batch of process conditions vectors 552. The training process continues until the average error across all process conditions vectors 552 is less than a selected threshold tolerance. When the average error is less than the selected threshold tolerance, the analysis model 502 training is complete and the analysis model is trained to accurately predict the thickness of gate metals based on the process conditions. The analysis model 502 can then be used to predict gate metal thicknesses and to select process conditions that will result in a desired gate metal thickness. During use of the trained model 502, a process conditions vector, representing current process condition for a current gate metal etching process to be performed, and having the same format at the process conditions vector 552, is provided to the trained analysis model 502. The trained analysis model 502 can then predict the thickness of a gate metal that will result from those process conditions.

A particular example of a neural network based analysis model 502 has been described in relation to FIG. 5B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

FIG. 6 is a flow diagram of a method 600 for forming an integrated circuit, in accordance with some embodiments. The method 600 can utilize processes, components, and systems described in relation to FIGS. 1-6. At 602, the method 600 includes forming a first gate all around transistor on a semiconductor substrate in a first wafer, wherein the semiconductor substrate includes a first semiconductor layer, an etch-stop layer on the first semiconductor layer, and a second semiconductor layer on the etch-stop layer. One example of a gate all around transistor is the gate all around transistor 102 of FIG. 2B. One example of a first wafer is the first wafer 101 of FIG. 2K. One example of a semiconductor substrate is the semiconductor substrate 106 of FIG. 2K. One example of a first semiconductor layer is the first semiconductor layer 112 of FIG. 2K. One example of an etch-stop layer is the etch-stop layer 114 of FIG. 2K. One example of a second semiconductor layer is the second semiconductor layer 116 of FIG. 2K. At 604, the method 600 includes forming a backside conductive via extending through the semiconductor substrate to a source region of the first gate all around transistor. One example of a backside conductive via is the backside conductive via 109 of FIG. 2K. One example of a source region is the source region 130 of FIG. 2K. At 606, the method 600 includes bonding a second wafer to the semiconductor substrate. One example of a second wafer is the second wafer 105 of FIG. 2K.

Figure 7:
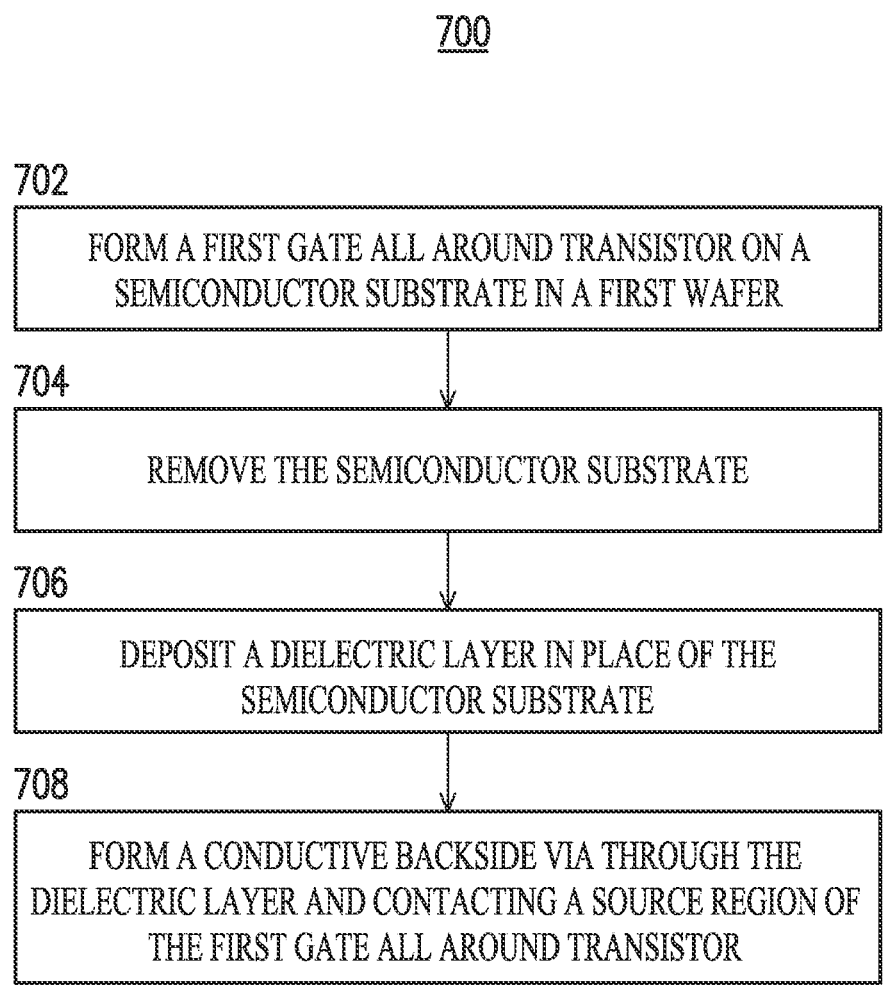
FIG. 7 is a flow diagram of a method for operating an electronic device, according to some embodiments.

FIG. 7 is a flow diagram of a method 700 for forming an integrated circuit, in accordance with some embodiments. The method 700 can utilize processes, components, and systems described in relation to FIGS. 1-6. At 702, the method 700 includes forming a first gate all around transistor on a semiconductor substrate in a first wafer. One example of a gate all around transistor is the gate all around transistor 102 of FIG. 3A. One example of a semiconductor substrate is the semiconductor substrate 106 of FIG. 3A. At 704, the method 700 includes removing the semiconductor substrate. At 706, the method 700 includes depositing a dielectric layer in place of the semiconductor substrate. One example of a dielectric layer is the dielectric layer 166 of FIG. 3H. At 708, the method 700 includes forming a backside conductive via through the dielectric layer and contacting a source region of the first gate all around transistor.

The backside conductive vias provide many benefits. For example, electronic circuitry such as memory arrays or sensor arrays are formed in the second wafer, while logic transistors are formed in the first wafer. This enables highly dense formation of transistors in the first wafer. Because the etch-stop layer prevents over-etching, proper functionality of the gate all around transistors is ensured. Integrated circuits have higher performance and there are fewer scrapped wafers, resulting in higher yields.

In one embodiment, an integrated circuit includes a first chip. The first chip includes a substrate, a first gate all around transistor on the substrate and having a source region, and a backside conductive via extending through the substrate to the source region.

In one embodiment, a method includes forming a first gate all around transistor on a semiconductor substrate in a first wafer. The semiconductor substrate includes a first semiconductor layer, an etch stop layer on the first semiconductor layer, and a second semiconductor layer on the etch stop layer. The method includes forming a backside conductive via extending through the semiconductor substrate to a source region of the first gate all around transistor and bonding a second wafer to the semiconductor substrate.

In one embodiment, a method includes forming a first gate all around transistor on a semiconductor substrate in a first wafer and removing the semiconductor substrate. The method includes depositing a dielectric layer in place of the semiconductor substrate and forming a backside conductive via through the dielectric layer and contacting a source region of the first gate all around transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An integrated circuit, comprising:
   a first chip including:
      a substrate including:
         a first semiconductor layer;
         an etch-stop layer on the first semiconductor layer; and
         a second semiconductor layer on the etch-stop layer
      a first gate all around transistor on the substrate and having a source region; and
      a backside conductive via extending through the substrate to the source region, wherein the conductive via extends through the first semiconductor layer, the etch-stop layer, and the second semiconductor layer.

2. The integrated circuit of claim 1, wherein the etch-stop layer is selectively etchable with respect to the first and second semiconductor layers.

3. The integrated circuit of claim 2, wherein the etch-stop layer is a dielectric layer.

4. The integrated circuit of claim 3, wherein the etch-stop layer is a third semiconductor layer.

5. The integrated circuit of claim 1, further comprising a second chip bonded to the first chip and including:
   electronic circuitry; and
   a metal structure in contact with the backside via and electrically connecting the gate all around transistor to the electronic circuitry.

6. The integrated circuit of claim 1, wherein the electrical circuitry includes a memory array.

7. The integrated circuit of claim 1, wherein the first chip includes a second gate all around transistor sharing the source region of the first gate all around transistor.

8. The integrated circuit of claim 1, wherein the first chip includes:
   a second gate all around transistor having a source region;
   a shallow trench isolation separating the source region of the first gate all around transistor and the source region of the second gate all around transistor, wherein the backside conductive via contacts the source region of the first gate all around transistor and the source region of the second gate all around transistor.

9. An integrated circuit, comprising:
   a first chip including:
      a substrate including:
         a first semiconductor layer;
         an etch-stop layer on the first semiconductor layer; and
         a second semiconductor layer on the etch-stop layer;
      a first gate all around transistor on the substrate and including a source/drain region;
      a backside conductive via extending through the substrate to the source/drain region of the first gate all around transistor.

10. The integrated circuit of claim 9, comprising a second chip bonded to the first chip.

11. The integrated circuit of claim 10, the second chip includes a metal structure electrically coupled to the backside conductive via.

12. The integrated circuit of claim 9, wherein a thickness of the substrate is less than 10 µm.

13. The device of claim 9, further comprising:
   a second gate all around transistor on the semiconductor substrate; and
   a shallow trench isolation between the source region of the first gate all around transistor and a source/drain region of the second gate all around transistor, wherein the backside conductive via contacts the source/drain regions of both the first and second gate all around transistors.

14. The device of claim 9, comprising a silicide on the source/drain region.

15. A device, comprising:
   a first chip including:
      a semiconductor substrate including a first semiconductor layer, a second semiconductor layer, and an etch-stop layer between the first semiconductor layer and the second semiconductor layer;
      a first gate all around transistor on a semiconductor substrate and including a first source/drain region;
      a second gate all around transistor on the semiconductor substrate and including a second source/drain region; and
      a backside conductive via extending through the semiconductor substrate and electrically contacting the first source/drain region and the second source/drain region of the first gate all around transistor.

16. The device of claim 15, comprising a second chip bonded to the semiconductor substrate.

17. The device of claim 15, wherein the first chip includes a dielectric layer on the semiconductor substrate opposite the first gate all around transistor, wherein the backside conductive via extends through the dielectric layer.

18. The device of claim 15, comprising a first silicide on the first source/drain region and a second silicide on the second source/drain region, wherein the backside conductive via is in contact with both the first silicide and the second silicide.

19. The deice of claim 15, wherein the etch-stop layer is selectively etchable with respect to the first and second semiconductor layers.

20. The deice of claim 9, wherein the etch-stop layer is selectively etchable with respect to the first and second semiconductor layers.

* * * * *